(12) United States Patent
Yamaguchi

(10) Patent No.: US 8,178,828 B2
(45) Date of Patent: May 15, 2012

(54) PHOTO-SENSING DEVICE, PHOTOSENSOR, AND DISPLAY DEVICE

(75) Inventor: Ikuhiro Yamaguchi, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 580 days.

(21) Appl. No.: 12/404,267

(22) Filed: Mar. 13, 2009

(65) Prior Publication Data

US 2009/0236504 A1 Sep. 24, 2009

(30) Foreign Application Priority Data

Mar. 24, 2008 (JP) ................... 2008-076880

(51) Int. Cl.
*H01L 31/00* (2006.01)
*H01L 23/48* (2006.01)
*G06M 7/00* (2006.01)
(52) U.S. Cl. ...................... 250/214.1; 250/221; 257/734
(58) Field of Classification Search ............... 250/208.1, 250/214.1, 216, 226, 221; 257/40, 288, 431, 257/734–736
See application file for complete search history.

(56) References Cited

U.S. PATENT DOCUMENTS

| 4,460,253 A * | 7/1984 | Kawai et al. .................. 396/258 |
| 4,808,833 A * | 2/1989 | Saito .......................... 250/578.1 |
| 5,338,690 A * | 8/1994 | Fukaya et al. .................. 438/59 |
| 7,005,644 B2 * | 2/2006 | Ishikawa et al. ......... 250/339.04 |
| 7,253,460 B2 * | 8/2007 | Nakamura .................... 257/288 |
| 2007/0251573 A1 * | 11/2007 | Suezaki et al. ............... 136/258 |
| 2008/0230768 A1 * | 9/2008 | Goh .............................. 257/40 |

FOREIGN PATENT DOCUMENTS

JP 2000-46876 A 2/2000

* cited by examiner

*Primary Examiner* — Georgia Y Epps
*Assistant Examiner* — Don Williams
(74) *Attorney, Agent, or Firm* — Chen Yoshimura LLP

(57) ABSTRACT

A photo-sensing device is disclosed, comprising a photoelectric conversion semiconductor thin film, thin films for ohmic contacts to be provided to form an incident light window on one face of the photoelectric conversion semiconductor thin film, first and second ohmic electrodes installed on the thin films for the ohmic contacts, a connection wiring for short-circuiting the first and the second ohmic electrodes, an insulating film provided on the other face of the photoelectric conversion semiconductor thin film, and a first electrode provided on the face of the insulating film that does not contact the photoelectric conversion semiconductor thin film.

30 Claims, 16 Drawing Sheets

PHOTO-SENSING DEVICE, PHOTOSENSOR, AND DISPLAY DEVICE

This application claims the benefit of Japanese Application No. JP 2008-076880 filed, in Japan on Mar. 24, 2008, of which is hereby incorporated by reference in this entirety.

BACKGROUND OF THE INVENTION

1. Field of the Invention

The present invention relates to a photo-sensing device, a photosensor and a display device.

2. Description of the Related Art

Thin-film phototransistors featuring thin-film transistors (TFTs) are well known.

FIGS. 17A and 17B show a typical structure of a conventional thin-film phototransistor 80. FIG. 17A is a perspective plan view illustrating the structure of a conventional thin-film phototransistor 80. FIG. 17B is a cross-sectional view of the phototransistor in FIG. 17A taken along a line D-D. The thin-film phototransistor 80, which has the same structure as a TFT installed in the pixel display part of a TFT liquid crystal display, is configured as an amorphous silicon (a-Si) TFT. The thin-film phototransistor 80 includes a substrate 81 made of glass or other materials, a gate electrode 82 formed on the upper face of the substrate 81, a gate insulating film 83 formed on top of the substrate 81 and covering the upper face of the gate electrode 82, a photoelectric conversion semiconductor thin film 84, which is provided on the central area of the gate insulating film 83 and serves as an optical sensing layer and a channel, a channel passivation film 85 patterned on the central area of the photoelectric conversion semiconductor thin film 84, a source electrode 87 and a drain electrode 88 made of a light-blocking conductive material and formed via a first and a second ohmic contact layers 86a and 86b on both sides of the channel passivation film 85, and an overcoat film 89 formed over the entire surface including the source electrode 87, the drain electrode 88 and the channel passivation film 85.

FIG. 18 is a typical circuit diagram of an amplifier using the thin-film phototransistor 80 as shown in FIG. 17A, namely a photosensor. The photosensor 92 is a two-stage amplification circuit comprising two operational amplifiers OP1 and OP2. The thin-film phototransistor 80 is connected to the noninverting input terminal of the operational amplifier OP1. The operational amplifier OP1, which includes a feedback resistor R1 connected between the noninverting input terminal and the output terminal of the operational amplifier OP1, converts electric current into voltage (i.e., current-voltage conversion). The operational amplifier OP2, which includes an input resistor R2 connected between the noninverting input terminal and the output terminal of the operational amplifier OP1, and a feedback resistor R3 connected between the noninverting input terminal and the output terminal, amplifies voltage. A peak detector comprising two operational amplifiers OP1 and OP2 is disclosed in Japanese Patent Laid Open Application, JP2000-46876 A, for example.

FIG. 19A is a schematic cross-sectional view illustrating the operation of the thin-film phototransistor 80, and FIG. 19B is an equivalent circuit diagram of the thin-film phototransistor 80. A negative DC voltage, −10 V for example, is applied to minimize dark current (output during unexposed periods), thus increasing the ratio of light current to dark current (i.e., light current/dark current ratio). A positive or negative constant DC voltage is applied between the source electrode 87 and the drain electrode 88.

In the thin-film phototransistor 80 as shown in FIG. 19A, holes are induced in the region near the interface between the channel and the gate insulating film 83 by the application of negative gate voltage (Vg). Namely, the intrinsic region of the a-Si photoelectric conversion semiconductor thin film 84, which serves as a channel, is inverted to a p-type semiconductor due to the electric field effect. Consequently, a structure similar to the p-i-n structure (pseudo-pin structure) is formed near the edge of the drain electrode 88. Likewise, the pseudo-pin structure is also formed on the side of the source electrode 87. Specifically, the thin-film phototransistor 80, when the negative gate voltage Vg is applied, is expressed as an equivalent circuit in which a pair of pin diodes is connected in series so that their rectification directions face opposite to each other as shown in FIG. 19B.

In the thin-film phototransistor 80, the current is flown from the drain electrode 88 to the source electrode 87 via the photoelectric conversion semiconductor thin film 84. If the incident light L is irradiated as shown in FIG. 19A, the absolute value of the current increases in proportion to the intensity of the incident light L entering the photoelectric conversion semiconductor thin film 84. Consequently, by converting this current, Iout, into voltage and amplifying the voltage with operational amplifiers OP1 and OP2 of the photosensor 92, the output voltage of the photosensor 92 turns into an illumination signal corresponding to the intensity of irradiation of the incident light L.

The thin-film phototransistor 80, which has the same structure as a TFT installed in the pixel display of a so-called TFT liquid crystal display as mentioned above, is formed through the same process as the TFT. Consequently, the thin-film phototransistor 80 can be integrated into a TFT liquid crystal display device easily and at low cost. Therefore, a light control function can be integrated by using the thin-film phototransistor 80 in such a display device. Unlike conventional pin-type photodiodes, the thin-film phototransistor 80 having the same structure as the TFT does not require a p-type semiconductor. The thin-film phototransistor 80 can thus be configured using a semiconductor material incapable of forming a p-type semiconductor such as a-Si. Therefore, the thin-film phototransistor 80 is expected to find widespread applications.

FIG. 20 is a schematic plan view of a typical display device 100 equipped with a conventional thin-film phototransistor 80. The display device 100 comprises multiple gate lines 103 provided in parallel to each other and extending in the horizontal direction on the surface of a substrate 102, multiple data lines 104 provided in parallel to each other and extending in the vertical direction, pixel display part 105 made up of multiple pixels formed at each cross-sectional area of the gate line 103 and the data line 104, and a thin-film phototransistor 80 provided at the periphery of the substrate 102, at the lower left corner in the case of FIG. 20. One end of each gate line 103, the left end in the case of FIG. 20, is connected to a gate driver 106, which supplies gate signals sequentially. One end of each data line, the upper end in the case of FIG. 20, is connected to a data driver 107, which supplies data signals sequentially.

As shown in FIGS. 17A and 17B, the thin-film phototransistor 80 has the same structure as the TFT of each pixel display part 105, and is formed on a substrate 102 simultaneously with the TFT. As shown in FIG. 20, bias voltages are applied to the gate electrode 82, the source electrode 87, and the drain electrode 88 of the thin-film phototransistor 80 from outside the display device 100. The thin-film phototransistor 80 outputs the output current, Iout, corresponding to the intensity of the incident light L. Consequently, by converting this output current, Iout, into voltage using the photosensor 92 as shown in FIG. 18, and then amplifying the voltage, illumination signals corresponding to the intensity of the incident light L can be obtained. By performing drive control of the backlight of the display device 100 based on these illumination signals, the illumination by the backlight having the light intensity corresponding to the brightness of surrounding area can be obtained, and eye-friendly display can thus be ensured.

In the conventional thin-film phototransistor 80, the source electrode 87 and the drain electrode 88 partially cover the channel passivation film 85, which also serves as an etching stopper, thus blocking the light coming into the photoelectric conversion semiconductor thin film 84 and preventing sufficient amount of photocurrent from being obtained.

A back-channel etching type thin-film phototransistor 80 provides larger photocurrent than that of the etching stopper type, because there is no undesirable light-blocking structure, the photoelectric conversion semiconductor thin film 84 is several times thicker than that of the etching stopper type, short channel length allows high-density packaging and others.

However, in the conventional thin-film phototransistor 80, the pseudo-pin junction is formed when the negative gate voltage Vg is applied to the region near the interface between the photoelectric conversion semiconductor thin film 84 and the gate insulating film 83 and the interface is inverted to a p-type semiconductor because of the electric field effect as mentioned above. Such pseudo-pin junction region is formed only within a limited area near the drain electrode 88. Furthermore, since the pin diode faces the forward direction on the side of the source electrode 87, it does not serve as a thin-film phototransistor 80. Such limitations are common to thin-film phototransistors 80, regardless of the type such as backchannel etching type and etching stopper type. The photocurrent obtained through a conventional thin-film phototransistor 80 is limited, which is why it is difficult to detect low illuminance accurately.

SUMMARY OF THE INVENTION

Accordingly, the object of the present invention is to provide a photo-sensing device having high sensitivity to an incident light and capable to be made compact, a photosensor, and a display device.

One of the preferred embodiments of the photo-sensing device of the present invention provides a photo-sensing device comprising a photoelectric conversion semiconductor thin film, a thin film for ohmic contacts provided to form an incident light window on one face of the photoelectric conversion semiconductor thin film, a first and a second ohmic electrodes provided on the thin film for ohmic contacts, a connection wiring for short-circuiting the first and the second ohmic electrodes, an insulating film provided on the other face of the photoelectric conversion semiconductor thin film, and a first electrode provided on the face of the insulating film that does not contact the photoelectric conversion semiconductor thin film.

In another aspect, the present invention provides a photo-sensing device including a photoelectric conversion semiconductor thin film, a first conductive type semiconductor thin film provided to form an incident window on one face of the photoelectric conversion semiconductor thin film, multiple electrodes provided over the first conductive semiconductor thin film, partially covering the first conductive semiconductor thin film, a connection wiring that short-circuits the multiple electrodes for output, an insulating film provided on the other face of the photoelectric conversion semiconductor thin film, and a first electrode provided on the face of the insulating film that does not contact the photoelectric conversion semiconductor thin film. And, the multiple electrodes and the connection wiring are integrated into one, a pulse voltage or an AC voltage is applied between the connection wiring and the first electrode, an incident light coming into the photoelectric conversion semiconductor thin film through the incident light window generates carriers, and a current corresponding to the carriers generated that flows between the connection wiring and the first electrode is detected as photocurrent.

In another aspect, the present invention provides a photosensor including a photo-sensing device and an output signal processing circuit, said photo-sensing device comprising: a photoelectric conversion semiconductor thin film, a thin film for ohmic contact provided to form an incident light window on one face of the photoelectric conversion semiconductor thin film, a first and a second ohmic electrodes provided on the thin film for the ohmic contacts, a connection wiring that short-circuits the first ohmic electrode and the second ohmic electrode, an insulating film provided on the other face of the photoelectric conversion semiconductor thin film, and a first electrode provided on the face of the insulating film that does not contact the photoelectric conversion semiconductor thin film. And, a pulse signal or an AC signal is applied between the connection wiring and the first electrode of the photo-sensing device, the connection wiring or the first electrode is connected to the output signal processing circuit, and a current that flows between the connection wiring and the first electrode of the photo-sensing device changes according to the amount of an incident light coming into the photoelectric conversion semiconductor thin film of the photo-sensing device and is converted into voltage in the output signal processing circuit.

In another aspect, the present invention provides a photosensor including a photo-sensing device, an AC voltage application means for applying AC voltage to the photo-sensing device, and a current detection means to be connected to the photo-sensing device. Said photo-sensing device comprises: a first electrode in specified surface structure provided via an insulating film on one side of the layer thickness direction of the semiconductor thin film, and a second and a third electrodes electrically connected to each other and provided on the other side of the other layer thickness direction so that a part of them is overlapped with the first electrode. Here, the AC voltage is applied by the AC voltage application means between the second and third electrode, and the first electrode of the photo-sensing device, and a current that is flown between the second and third electrode, and the first electrode of the photo-sensing device is detected by the current detection means.

In another aspect, the present invention provides a display device including a pixel display part formed on a substrate, and a photo-sensing device. Said pixel display part includes: gate lines that extend in the first direction in parallel to each other on the surface of the substrate, and to which gate signals are supplied from a gate driver, and data lines that extend in the second direction, which is different from the first direction, in parallel to each other and to which data signals are supplied from a data driver. And, pixels formed at the cross-sectional area of the gate lines and the data lines are provided in the pixel display part, and the pixels are driven via the gate lines and the data lines. Said photo-sensing device comprises: a photoelectric conversion semiconductor thin film provided on the substrate, a thin film for ohmic contacts provided to form an incident light window on one face of the photoelectric conversion semiconductor thin film, a first and a second ohmic electrodes provided on the thin film for ohmic contacts, a connection wiring for short-circuiting the first ohmic electrode and the second ohmic electrode, an insulating film provided on the other face of the photoelectric conversion semiconductor thin film, and a first electrode provided on the face of the insulating film that does not contact the photoelectric conversion semiconductor thin film.

In another aspect, the present invention provides a display device including: a pixel display part including: gate lines from which gate signals are supplied and data lines from which data signals are supplied, and a photosensor for operating the display status of said pixel display part. Said photosensor comprises: a photo-sensing device including; a first electrode in specified surface structure provided via an insulating film on one side of the layer thickness direction of the semiconductor thin film, and a second and a third electrodes electrically connected to each other and provided on the other side of the other layer thickness direction so that a part of them is overlapped with the first electrode, an AC voltage application means for applying the AC voltage between the second and third electrode, and the first electrode of the photo-sensing device; and a current detection means for detecting a current flown between the second and the third electrode, and the first electrode of the photo-sensing device. Here, said AC voltage application means applies gate signals to be supplied to the gate lines between the second and the third electrodes, and the first electrode.

According to present invention, large output current can be obtained, and the sensitivity to incident light can be enhanced while compactness is maintained.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Figure 1A:
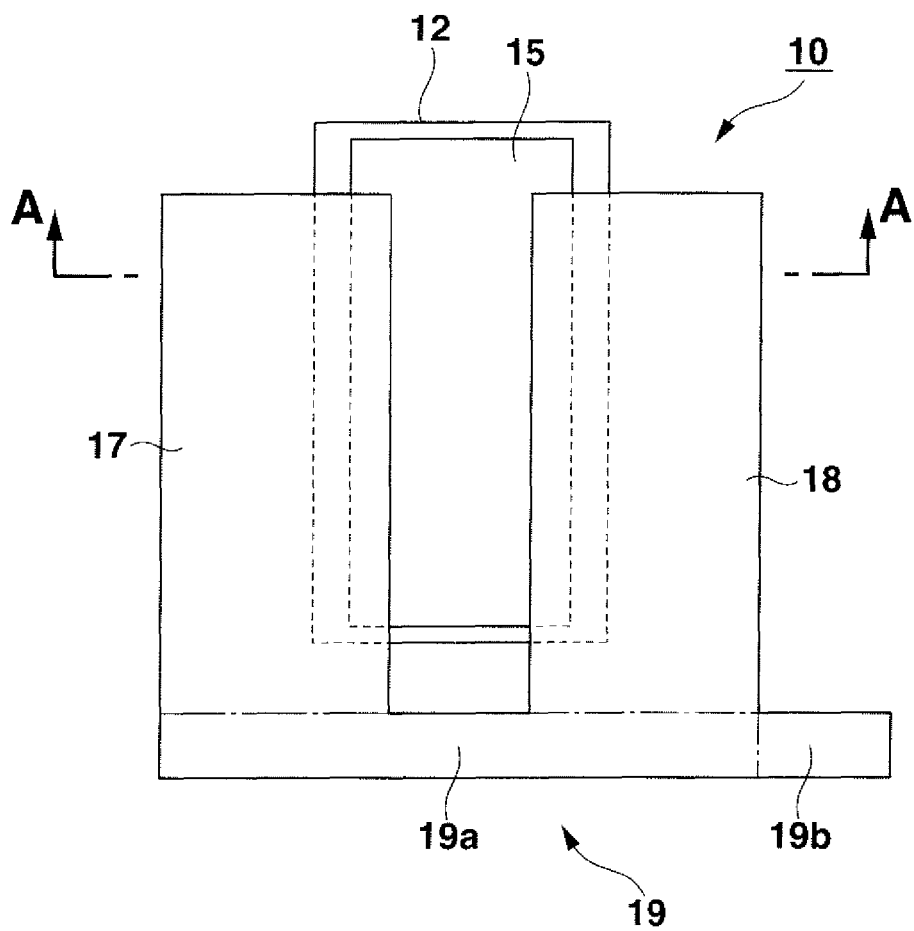
FIG. 1A is a perspective plan view illustrating a partial construction of a photo-sensing device.

Hereinafter, various embodiments of the present invention will be described in detail with reference to the figures in which like reference characters are used to designate like or corresponding components.

(Photo-Sensing Device)

A photo-sensing device of the present invention will be described first.

Figure 1B:
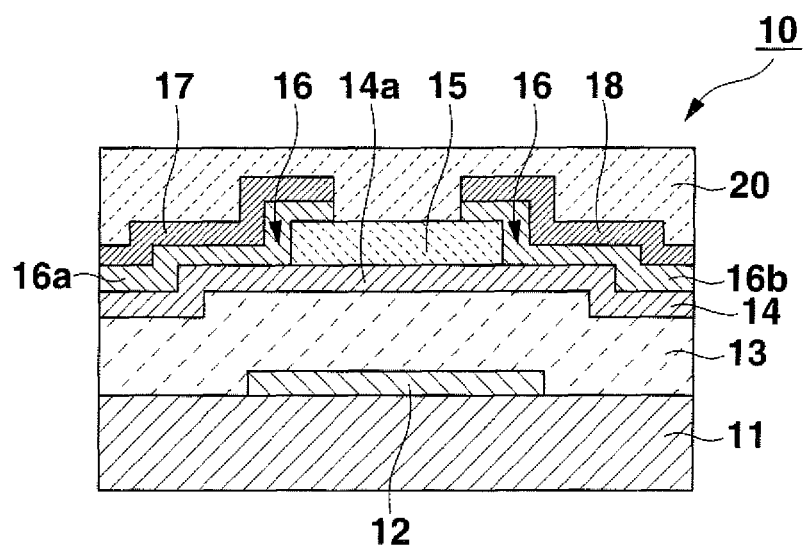
FIG. 1B is a cross-sectional view of the photo-sensing device in FIG. 1A taken along a line A-A.

FIG. 1A is a perspective plan view illustrating a partial construction of a photo-sensing device 10, and FIG. 1B is a cross-sectional view of the photo-sensing device in FIG. 1A taken along a line A-A.

As shown in FIG. 1B, a photo-sensing device 10 is comprised of a substrate 11, and following layers are provided onto the substrate 11 in order: a first electrode 12 on the lower side, an insulating film 13, a photoelectric conversion semiconductor thin film 14, an optical sensing region passivation film 15, a first and a second low resistance semiconductor thin films 16a and 16b, electrodes for the first and the second low resistance semiconductor thin films 17 and 18, and an overcoat film 20. The electrodes for the first and the second low resistance semiconductor thin films 17 and 18 are electrically connected with a connection wiring 19.

To distinguish from the first electrode 12, the electrode for the first low resistance semiconductor thin film 17 may be called the second electrode, and the electrode for the second low resistance semiconductor thin film may be called the third electrode.

Specifically, as shown in FIGS. 1A and 1B, a photo-sensing device 10 comprises: the photoelectric conversion semiconductor thin film 14, the first and the second low resistance semiconductor thin films 16a and 16b provided to form an incident light window on one face of the photoelectric conversion semiconductor thin film 14, an electrode 17 for the first low resistance semiconductor thin film 16a and another electrode 18 for the second low resistance semiconductor thin film 16b provided on the low resistance semiconductor thin films 16a and 16b respectively, a connection wiring 19 that short-circuits the electrode 17 for the first low resistance semiconductor thin film (second electrode) and the electrode 18 for the second low resistance semiconductor thin film (third electrode), an insulating film 13 provided on the other face of the photoelectric conversion semiconductor thin film 14, and the first electrode 12 provided on the face of the insulating film 13 that does not contact the photoelectric conversion semiconductor film 14. The first electrode 12, insulating film 13, and the photoelectric conversion semiconductor thin film 14 of the photo-sensing device 10 constitute a metal insulator semiconductor (MIS) capacitor. The electrodes 17 and 18 for the first and the second low resistance semiconductor thin films 16a and 16b may be provided so that a part of each of them overlaps with the first electrode 12.

The substrate 11 is made of glass, plastic, and other materials, and the surface of the substrate is flat.

The first electrode in specified surface structure is provided on one side of the layer thickness direction of the photoelectric conversion semiconductor thin film 14, which comprises a semiconductor thin film, via an insulating film 13. The first electrode 12 may also function as a pad for bonding. Furthermore, the first electrode 12 is connected to a pad for the first electrode via an interconnection pattern (not shown), and the pad for the first electrode and the terminal of the package are connected with a wire made of gold or other materials. The first electrode 12 is made of a conductive material such as chrome, chrome alloy, aluminum, aluminum alloy, and molybdenum for shielding of incident light. The first electrode 12 is formed sequentially following processes: a deposition process by the physical vapor deposition (PVD) or the chemical vapor deposition (CVD) methods, a masking process by the photo lithography method, and an etching process by the chemical etching method or the dry etching method of the formed metal layer.

The insulating film 13 is made of an insulating material such as silicon nitride and silicon oxide. The insulating film 13 is formed to cover the entire surface of the substrate 11 over the first electrode 12. The insulating film 13 is formed sequentially following processes: a deposition process by the PVD or CVD method, a masking process by the photo lithography method, and an etching process of the deposited insulating film by the chemical etching or dry etching method.

The photoelectric conversion semiconductor thin film 14 is a semiconductor thin film made of intrinsic amorphous silicon (i-Si) or high resistance amorphous silicon. The central area of the photoelectric conversion semiconductor thin film 14 serves as an optical sensing region 14a. The semiconductor thin film may be formed using at least two semiconductor thin film layers having different n-type impurity concentrations. The semiconductor thin film may be formed by layered structure with an n-type semiconductor thin film and an intrinsic semiconductor thin film layered on top of each other. In this case, it is desirable that the intrinsic semiconductor thin film may be disposed on the side of the insulating film 13, and the n-type semiconductor thin film may be disposed on the side of the electrode 17 for the first low resistance semiconductor thin film or the electrode 18 for the second low resistance semiconductor thin film. The incident light window, namely an opening, formed with the first and the second low resistance semiconductor thin films 16a and 16b extends on the surface of the optical sensing region 14a of the photoelectric conversion semiconductor thin film 14. The first and the second low resistance semiconductor thin films 16a and 16b are formed to be deposited on both surfaces of the photoelectric conversion semiconductor thin film 14 except for the photo acceptance area 14a at the center.

The photoelectric conversion semiconductor thin film 14 is formed by sequentially following processes: a deposition process by the CVD or other methods, a masking process by the photo lithography method, and an etching process of the deposited intrinsic amorphous silicon, etc. by the chemical etching method or dry etching method.

The optical sensing region passivation protective film 15 is a transparent film that protects the optical sensing region 14a, whose patterns are formed on the central region opposing the first electrode 12, on the face of the photoelectric conversion semiconductor thin film 14 that does not contact the insulating film 13. The optical sensing region passivation film 15 is made of silicon nitride, silicon oxide and others. The optical sensing region passivation film 15 is formed by the same process as the insulating film 13.

The first and the second low resistance semiconductor thin films 16a and 16b are so-called ohmic contact layers for the photoelectric conversion semiconductor thin film 14. The first and the second low resistance semiconductor thin films 16a and 16b are formed on the regions on both sides of the optical sensing region passivation film 15 and overlapped with the edges of the optical sensing region passivation film 15, on the face of the photoelectric conversion semiconductor thin film 14 that does not contact the insulating film 13. It is desirable that the surface patterns of the first and the second low resistance semiconductor thin films 16a and 16b match to the surface patterns of the electrodes 17 and 18 for the first and the second low resistance semiconductor thin films.

The first and the second low resistance semiconductor thin films 16a and 16b, which are made of n-type amorphous silicon, are underlayers of the electrodes 17 and 18 for the first and the second low resistance semiconductor thin films as the electrodes for the photoelectric conversion semiconductor thin film 14. The electrode 17 for the first low resistance semiconductor thin film serves as the first ohmic electrode for the first low resistance semiconductor thin film 16a. Likewise, the electrode 18 for the second low resistance semiconductor thin film serves as the second ohmic electrode for the second low resistance semiconductor thin film 16b. The n-type amorphous silicon can be obtained by injecting n-type impurities into a semiconductor layer deposited as intrinsic amorphous silicon on the upper layer of the optical sensing region passivation film 15. It is desirable that n-type impurities are doped into intrinsic amorphous silicon so that the impurity density falls within the $10^{16}$ to $10^{18}$ cm$^{-3}$ range. The n-type amorphous silicon is a low resistance layer, and may be so-called n+ layer having high impurity density in order to lower resistance. The impurity density of the n+ layer can be made to be $10^{18}$ cm$^{-3}$ or higher, for example.

For the sake of convenience in this specification, n-type semiconductor is called the first conductivity type semiconductor, and p-type semiconductor the second conductivity type semiconductor. Furthermore, the first and the second low resistance semiconductor thin films 16a and 16b are collectively called low resistance semiconductor thin film 16.

The electrodes 17 and 18 for the first and the second low resistance semiconductor thin films are deposited onto one side of the layer thickness direction of the semiconductor thin film comprising a photoelectric conversion semiconductor thin film 14 etc. partially overlapped with the first electrode 12, and they are electrically connected to each other. The electrode 17 for the first low resistance semiconductor thin film is deposited onto the first low resistance semiconductor thin film 16a. The electrode 18 for the second low resistance semiconductor thin film is deposited onto the second low resistance semiconductor thin film 16b. The electrodes 17 and 18 for the first and the second low resistance semiconductor thin films are made of a conductive material such as chrome, chrome alloy, aluminum, aluminum alloy, and molybdenum etc. as in the case of the first electrode 12. The electrodes 17 and 18 for the first and the second low resistance semiconductor thin films are formed by sequentially processes: a deposition process to form a metal layer, which becomes an electrode, by the PVD or CVD method, a masking process by the photolithography method, and an etching process of the deposited electrode layer by the chemical etching or dry etching method.

The first and the second low resistance semiconductor thin films 16a and 16b may be patterned by using the patterned electrodes 17 and 18 for the first and the second low resistance semiconductor thin films as the mask. Specifically, collective patterning may be performed so that the first low resistance semiconductor thin film 16a and the electrode 17 for the first low resistance semiconductor thin film, as well as the second low resistance semiconductor thin film 16b and the electrode 18 for the second low resistance semiconductor thin film, form identical surfaces.

The connection wiring 19 short-circuits the electrode 17 for the first low resistance semiconductor thin film and the electrode 18 for the second low resistance semiconductor thin film. Specifically, the connection wiring 19 consists of a connecting portion 19a, which makes electrical connection, and the wiring portion 19b, which serves as an interconnection wiring. The connection wiring 19 is made of a metal layer, which is the same as the material for the electrodes 17 and 18 for the first and the second low resistance semiconductor thin films, for example. In other words, the connection wiring 19 and the electrodes 17 and 18 for the first and the second low resistance semiconductor materials can be formed simultaneously.

In FIG. 1A, the boundary between the connection wiring 19 and the electrode 17 for the first low resistance semiconductor thin film, and the boundary between the connection wiring 19 and the electrode 18 for the second low resistance semiconductor thin film, are displayed in broken lines for the sake of convenience.

The wiring portion 19b of the connection wiring 19 may also serve as a pad for bonding. Furthermore, it may be connected to the pad for bonding with an interconnection pattern (not shown). The terminal of the package, in which the photo-sensing device 10 is mounted, and the pad for bonding are connected with a gold wire, for example.

The overcoat film 20 is made of silicon nitride, silicon oxide and others. The overcoat film 20 is formed over the entire surface of the substrate 11, covering the electrode 17 for the first low resistance semiconductor thin film, electrode 18 for the second low resistance semiconductor thin film, and the optical sensing region passivation film 15, which is exposed between the two electrodes. The overcoat film 20 is formed by following processes: a deposition process by the PVD or CVD method and a masking process by using photolithography as in the case of formation of the insulating film 13.

(Operation Principle 1 of a Photo-Sensing Device)

Hereinafter, the operation principle of the above-mentioned photo-sensing device 10 will be described.

Figure 2A:
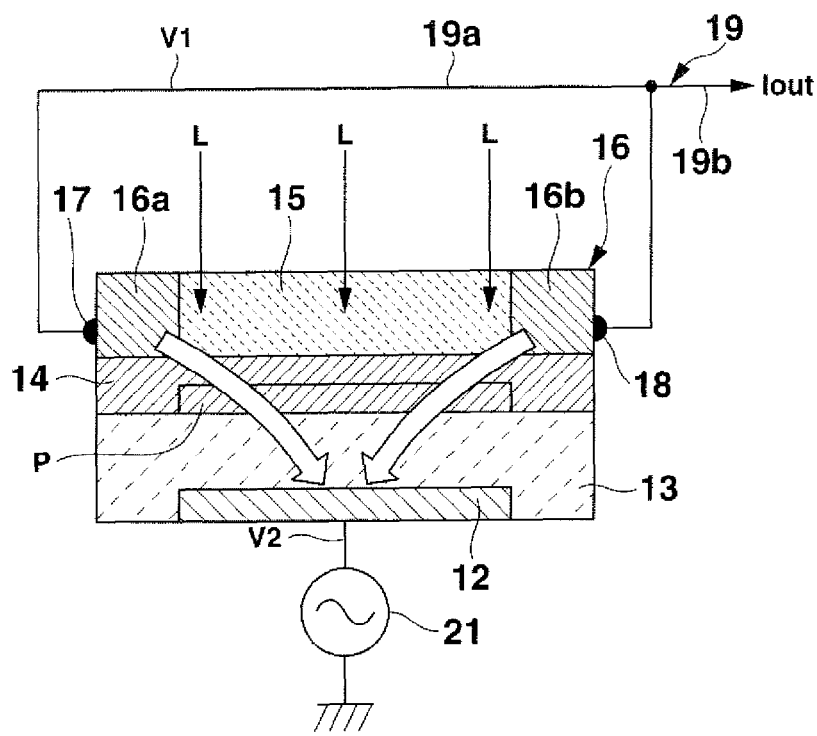
FIG. 2A is a diagram illustrating the operation of a photo-sensing device.
Figure 2B:
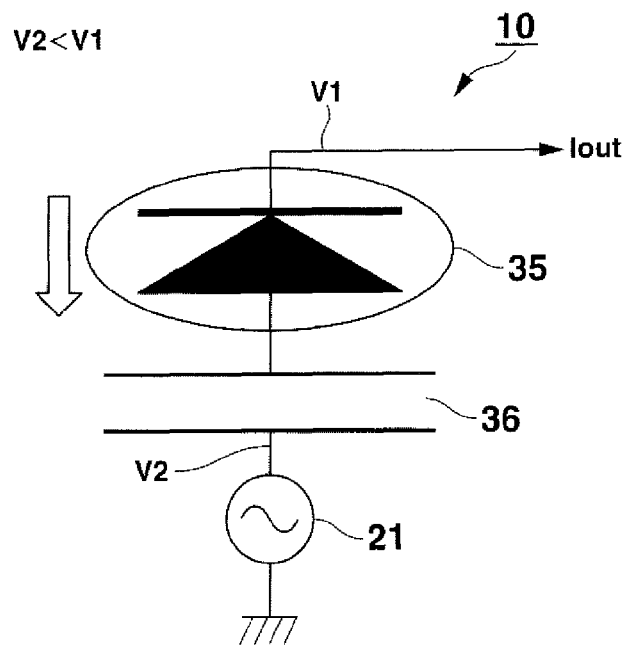
FIG. 2B is a diagram illustrating an equivalent circuit of a photo-sensing device.
Figure 2C:
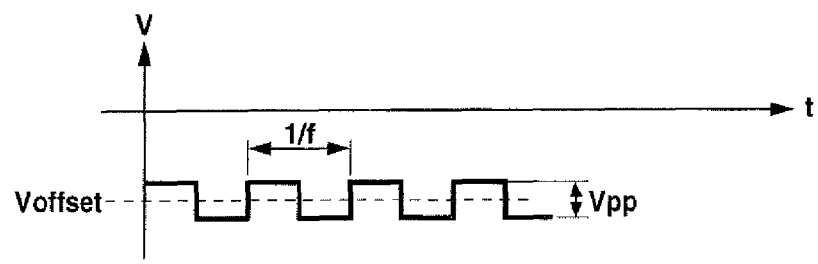
FIG. 2C is a diagram illustrating a typical waveform to be applied to a first electrode of a photo-sensing device.

FIG. 2A is a diagram illustrating the operation of a photo-sensing device, FIG. 2B is a diagram illustrating an equivalent circuit of a photo-sensing device, and FIG. 2C is a diagram illustrating a typical waveform applied to a first electrode of a photo-sensing device.

In the photo-sensing device 10 shown in FIG. 2A, the connection wiring 19 is connected to a load resistance (not shown), the first electrode 12 is connected to a pulsed power supply 21, and incident light L is irradiated to the optical sensing region 14a of a photoelectric conversion semiconductor thin film 14. The grounding side of the load resistance is connected to the grounding side of the pulsed power supply 21. As mentioned above, the first electrode 12, the insulating film 13, and the photoelectric conversion semiconductor thin film 14, which serves as an optical sensing layer, of the photo-sensing device 10 constitute the MIS-type capacitor.

Suppose that the photoelectric conversion semiconductor thin film 14 of the photo-sensing device 10 is a high resistance n-type semiconductor (also called a ν layer). In this case, the voltage to be applied to the connection wiring 19 of the photo-sensing device 10 is displayed as V1, and the voltage to be applied to the first electrode 12 is displayed as V2. If V2<V1, the photo-sensing device 10 can be approximately expressed by an equivalent circuit shown in FIG. 2B. As shown in FIG. 2C, a pulse signal has a waveform consisting of a pulse waveform, whose amplitudes between peaks is expressed as Vpp, overlapped with offset voltage (Voffset) having negative DC voltage. Negative offset DC voltage is used in order for V2 to become smaller than V1 (V2<V1)

In a photoelectric conversion semiconductor thin film 14, even if voltage is applied to the first electrode 12 in the form of pulse signals, the average voltage remains negative i.e. offset voltage when the pulse signal voltage is sufficiently smaller than the offset voltage. Consequently, DC voltage that satisfies V2<V1 is applied to the photo-sensing device 10 at all times. As a result, holes are induced on the interface between the insulating film 13 and the photoelectric conversion semiconductor thin film 14, forming a second conductive type, namely p-type, semiconductor. The photoelectric conversion semiconductor thin film 14 in regions other than this interface is a ν layer, and the first and the second low resistance semiconductor thin films 16a and 16b are n-type semiconductor layers. Specifically, in the photo-sensing device 10, the photoelectric conversion semiconductor thin film 14 consisting of a p-type semiconductor layer formed on the interface between the insulating film 13 and the photoelectric conversion semiconductor thin film 14 and a ν layer, and an approximately-pin-structured photo diode in the n-type low resistance semiconductor thin film 16, namely pin photo-diode 35, are connected to an MIS-type capacitor 36 in series.

The area of the equivalent pin photodiode 35 of the photo-sensing device 10 of this time is compared to a conventional thin film phototransistor 80 having the same optical sensing area.

The area of the pin photodiode 35 of the photo-sensing device 10 is approximately the same as the area of the optical sensing region 14a of the photoelectric conversion semiconductor thin film 14. On the contrary, the pin photodiode, which serves as the optical sensing region of the conventional thin film photo transistor 80, is formed only in the regions adjacent to the drain electrode 88. Consequently, the area of the equivalent pin photodiode 35 of the photo-sensing device 10 is significantly larger than the area of the pin photodiode formed near the drain electrode 88 of the conventional thin film phototransistor 80. Thus, it means that a large-area pin photodiode 35 is connected to the capacitor 36 in the equivalent circuit of the photo-sensing device 10.

When the pulsed power supply 21 is connected to a capacitor 36 and the potential difference between the electrode 17 and 18 for the first and second low resistance semiconductor thin film and the first electrode 12 changes to V2<V1, the pin photodiode 35 is formed. The only pulsed or AC signal from the pulsed power supply 21 are input into the pin photodiode via the capacitor 36. Current is flown in response to the pulse signals input via the insulating film 13 placed between the electrodes 17 and 18 for the first and second low resistance semiconductor thin film and the first electrode 12. In this case, when an incident light L is irradiated to the photoelectric conversion semiconductor thin film 14, the light-modulated current by the pin photodiode 35 is flown in the direction shown by the arrow mark. Specifically, carriers are generated as a result of irradiation of incident light L into the optical sensing region 14a through the incident light window created on the low resistance semiconductor film 16, and the generated carriers pass through the pin junction. Depending on the amount of light coming into the incident light window, each detection current flown through the electrodes 17 and 18 for the first and the second low resistance semiconductor thin films joins together, and output through the connection wiring 19 as an optical current.

As a result, the amplitude of the output current, Iout, from the connection wiring 19 is modulated by the intensity of irradiation of incident light L into the photoelectric conversion semiconductor thin film 14. In this case, in the optical sensing region 14a placed between the electrodes 17 and 18 for the first and the second low resistance semiconductor thin films, the current is flown not only in the horizontal direction but also in the vertical direction as shown by the arrow mark.

As described later, the electrode to be connected to the pulsed power supply 21 and the electrode for taking out the output current may be either the connection wiring 19 or the first electrode 12. Consequently, in the photo-sensing device 10, pulsed voltage or AC voltage is applied between the connection wiring 19 and the first electrode, carriers are generated as a result of the incidence of light into the photoelectric conversion semiconductor thin film 14 through the incident light window, and the current in accordance with the amount of carriers thus generated is detected as the photocurrent to be flown between the connection wiring 19 and the first electrode 12. In this case, if the pulsed voltage or AC voltage is made to be DC voltage that allows the interface between the photoelectric conversion semiconductor thin film 14 and the insulating film 13 to become the second conductive type at least at some instant, the photo-sensing device 10 operates that the pin photodiode 35 and the capacitor 36 are connected in series.

Consequently, the photocurrent that flows through the photo-sensing device 10 also crosses some regions of the pin photodiode 35 diagonally, and thus the same effect is obtained as the case in which the cross-sectional area of the pin photodiode 35 is enlarged. As a result, in the photo-sensing device 10, the area of the pin photodiode 35 increases as shown by the equivalent circuit in FIG. 2B, and thereby the large photocurrent flows.

The photo-sensing device 10 yields larger photocurrent under the same incident light irradiation intensity compared with the conventional TFT type thin film phototransistor 80, since especially photocurrent in the pin photodiode 35 flows both in horizontal and vertical directions. Thus, the sensitivity of the photo-sensing device 10 is enhanced. To obtain the same amount of photocurrent as the conventional TFT thin-film phototransistor 80, the area of the photo-sensing device 10 can be made smaller. This allows downsizing.

Therefore, the photo-sensing device 10 having higher sensitivity can be manufactured in the same process as that of the conventional TFT thin-film phototransistor 80, since the connection wiring 19 of the photo-sensing device 10 can thus be formed simultaneously with the electrodes 17 and 18 for the first and the second low resistance semiconductor films.

(Operation Principle 2 of the Photo-Sensing Device)

A photo-sensing device 10 also operates when voltage V1 to be applied to the connection wiring 19 is smaller than voltage V2 to be applied to the first electrode 12 (i.e. V2>V1).

Figure 3A:
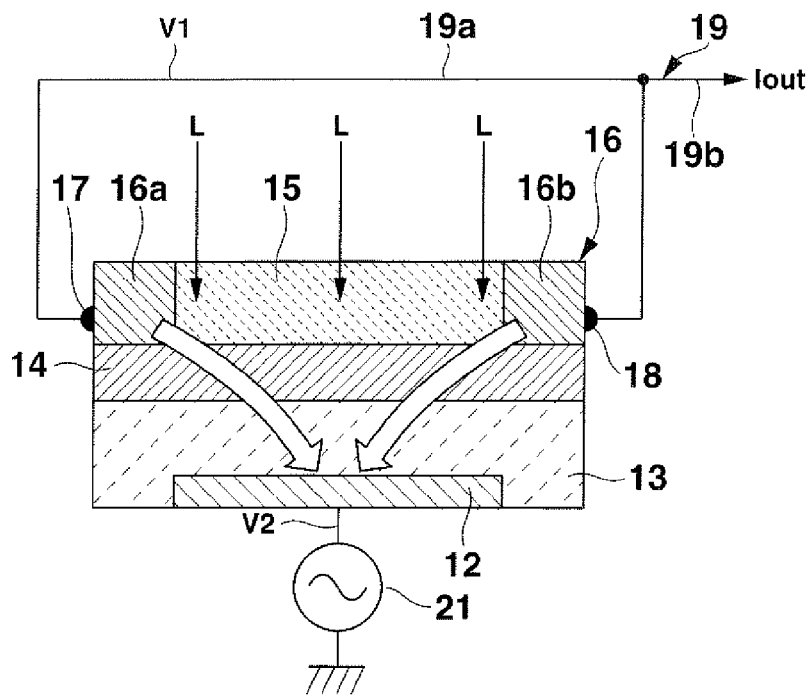
FIG. 3A is a diagram illustrating another operation of a photo-sensing device.
Figure 3B:
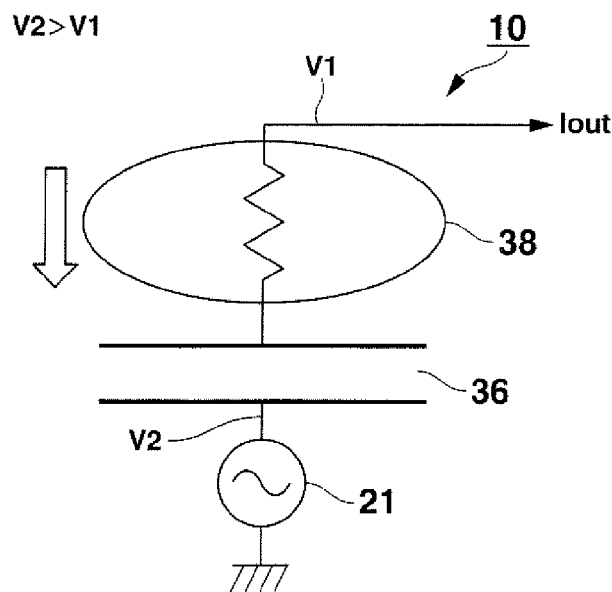
FIG. 3B is a diagram illustrating an equivalent circuit diagram of a photo-sensing device.
Figure 3C:
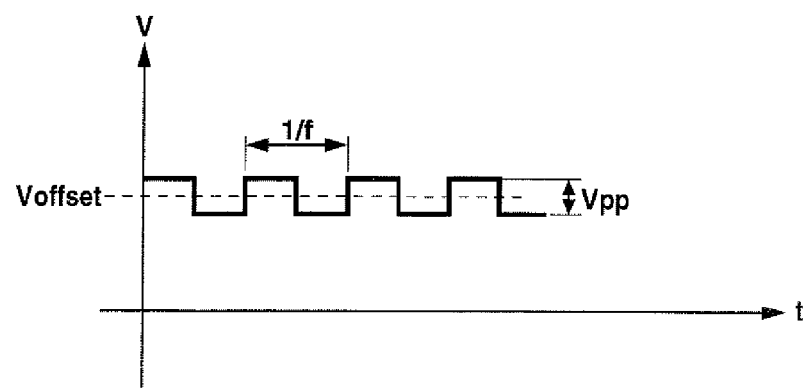
FIG. 3C is a diagram illustrating a typical waveform to be applied to a first electrode of a photo-sensing device.

FIG. 3A is a diagram illustrating another operation of a photo-sensing device 10, FIG. 3B is a diagram illustrating an equivalent circuit diagram of the photo-sensing device 10, and FIG. 3C is a diagram illustrating a typical waveform to be applied to the first electrode 12 of the photo-sensing device.

As shown in FIG. 3A, voltages V1 and V2 (V2>V1) are applied to the photo-sensing device 10. Specifically, a typical waveform, as shown in FIG. 3C, has a pulse waveform, whose amplitudes between peaks is expressed as Vpp, and overlapped offset voltage (Voffset) having positive DC voltage. In this case, the average value of the voltage applied to the first electrode 12 of the photoelectric conversion semiconductor thin film 14 remains positive even if pulsed signals are applied. Consequently, the interface of the photoelectric conversion semiconductor thin film 14 which faces to the insulating film 13 is not inverted and the interface remains n-type semiconductor. The layer between the insulating film 13 and the connection wiring 19 is an n-layer conductor consisting of a photoelectric conversion semiconductor thin film 14 and the first and the second low resistance semiconductor thin films 16a and 16b, which serves in approximately the same way as n-type photoconductor, namely photoconductor 38, when the light is illuminated. Consequently, the photo-sensing device 10 functions as an equivalent circuit having the photoconductor 38 and the MIS-type capacitor 36 connected in series. The equivalent circuit is the same as that of the photo-sensing device 10 in the case of V2<V1 except that the pin photodiode 35 is replaced by the photo conductor 38.

The existence of the photoconductor 38 allows large current to be flown to the photo-sensing device 10 even if incident light L is not irradiated. The ratio of the current flowing through the photo-sensing device 10 when incident light L is irradiated (ON) and when the incident light L is not irradiated (OFF) is regarded as the ON/OFF ratio. The ON/OFF ratio of the photo-sensing device 10 in FIG. 3A is smaller than that of the photo-sensing device 10 in FIG. 2A.

If the ON/OFF ratio is required to be large, voltage V1 to be applied to the connection wiring 19 of the photo-sensing device 10 is made to be larger than voltage V2 to be applied to the first electrode 12 (V2<V1), thus allowing the circuit to function as the equivalent circuit in which the pin photodiode 35 and the capacitor 36 are connected in series.

Hereinafter, the case in which the photoelectric conversion semiconductor thin film 14 is not an n-type high resistivity semiconductor but a p-type high resistivity semiconductor (also called π-type semiconductor) will be described.

Suppose that V1 is the voltage to be applied to the connection wiring 19 of the photo-sensing device, and V2 is the voltage to be applied to the first electrode 12. If V2 is larger than V1 (V2>V1), the photo-sensing device 10 is approximately expressed as the equivalent circuit shown in FIG. 2B. Meanwhile, if V2 is smaller than V1 (V2<V1), the photo-sensing device 10 is approximately expressed as the equivalent circuit shown in FIG. 3B. Unless otherwise specified, the photoelectric conversion semiconductor thin film 14 is high resistance n-type semiconductor in the following descriptions.

(Variations of the Photo Sensing Device)

Variations of the photo-sensing device are described below.

Figure 4A:
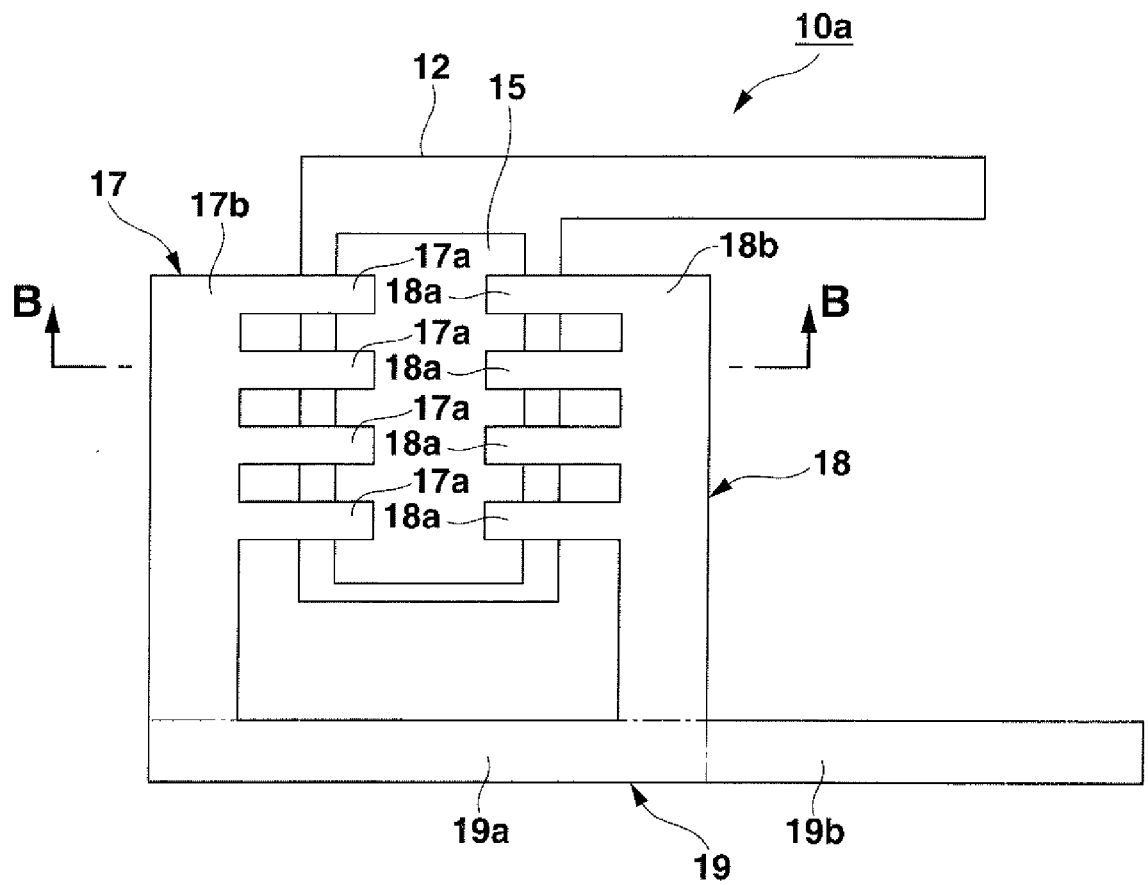
FIG. 4A is a perspective plan view illustrating a structure of a modified photo-sensing device.
Figure 4B:
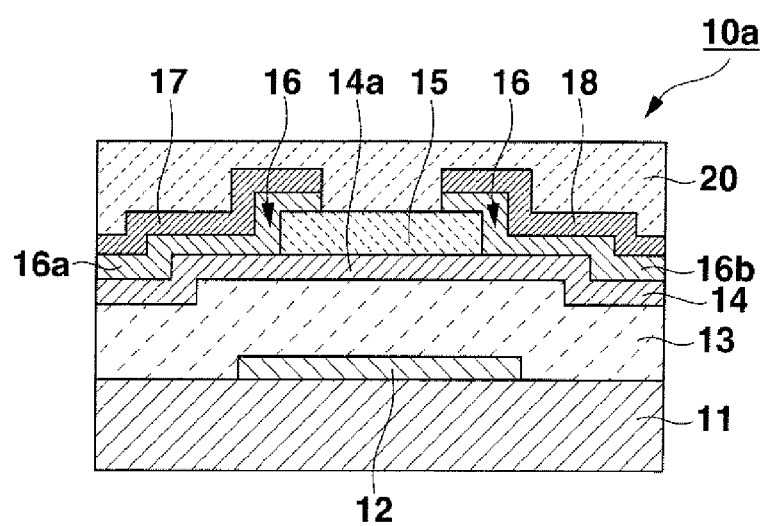
FIG. 4B is a cross-sectional view of the photo-sensing device in FIG. 4A taken along a line B-B.

FIG. 4A is a perspective plan view illustrating a structure of a modified photo-sensing device, and FIG. 4B is a cross-sectional view of the photo-sensing device in FIG. 4A taken along a line B-B. As shown in FIG. 4A, the surface structure of the electrode 17 for the first low resistance semiconductor thin film and the electrode 18 for the second low resistance semiconductor thin film of the photo-sensing device 10a is different from that of the photo-sensing device 10 in FIG. 1A.

As shown in FIG. 4A, the electrodes 17 and 18 for the first and the second low resistance semiconductor thin films of the photo-sensing device 10a and those of the photo-sensing device 10 shown in FIG. 1 differ in that the former are provided with multiple comb-shaped electrodes 17a and 18a extending to the optical sensing region 14a of the photoelectric conversion semiconductor thin film 14, while the latter are provided with none. The electrode 17 for the first low resistance semiconductor thin film joins the multiple comb-shaped electrodes 17a with the connecting portion 17b. The electrode 18 for the second low resistance semiconductor thin film joins the multiple comb-shaped electrodes 18a with the connecting portion 18b as in the case of the electrode 17 for the first low resistance semiconductor thin film. The comb-shaped electrodes 17a and 18a are also called stripe electrodes or finger electrodes.

As shown in FIG. 4A, the connection wiring 19 consists of a connecting portion 19a and a wiring portion 19b. The bottom edge of the connecting portion 17b of the electrode 17 for the first low resistance semiconductor thin film and that of the connecting portion 18b of the electrode 18 for the second low resistance semiconductor film are both connected to the connecting portion 19a.

As shown in FIG. 4A, it shows the cross-sectional view of the photo-sensing device 10a taken along a longitudinal direction of the comb-shaped electrodes 17a and 18a. The photo-sensing device in 10a has the same shape as the photo-sensing device 10 as shown in FIG. 1.

Since the electrodes 17 and 18 for the first and the second low resistance semiconductor thin films of the photo-sensing device 10a in the above construction are in a comb-like shape having teeth 17a and 18a, the area of the optical sensing region 14a of the photoelectric conversion semiconductor thin film 14 covered by the electrodes 17 and 18 for the first and the second low resistance semiconductor thin films is smaller than that of the photo-sensing device 10 shown in FIG. 1. Consequently. The area of the optical sensing region 14a of the photoelectric conversion semiconductor thin film 14 increases, thus enhancing the optical sensitivity of the photo-sensing device 10a to incident light L.

Figure 5A:
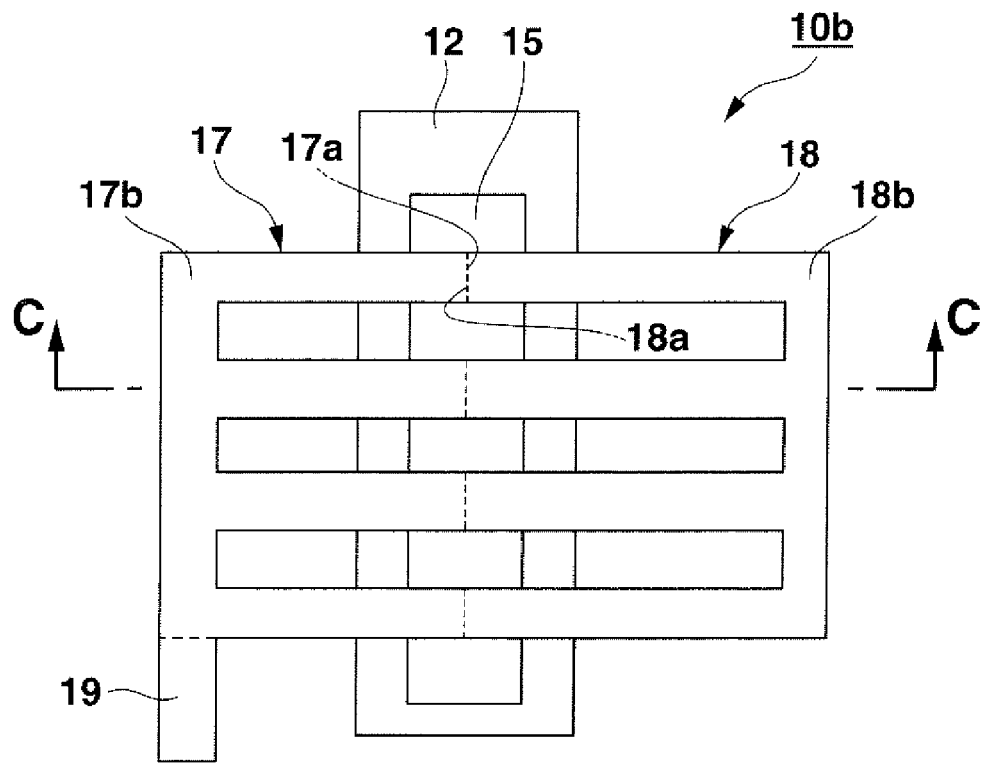
FIG. 5A is a perspective plan view illustrating another structure of photo-sensing device.
Figure 5B:
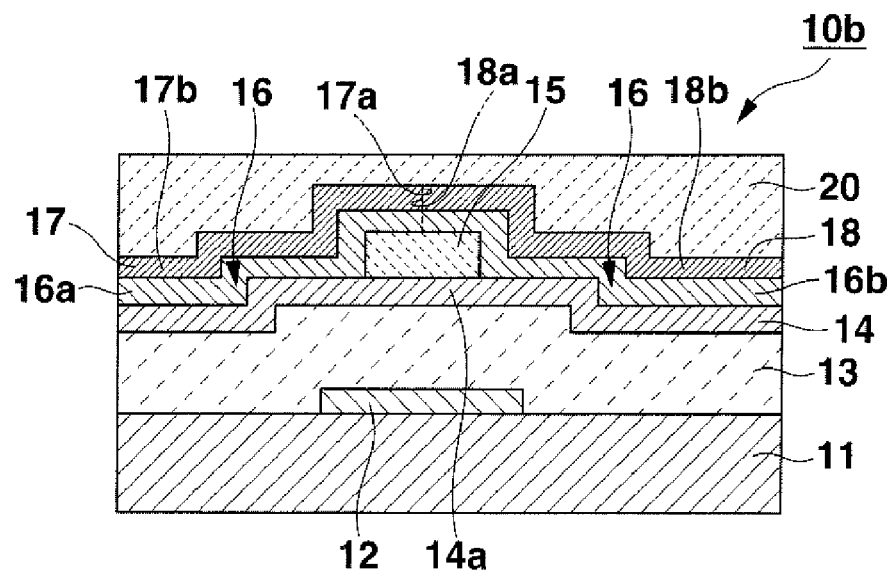
FIG. 5B is a cross-sectional view of the photo-sensing device in FIG. 5A taken along a line C-C.

FIG. 5A is a perspective plan view illustrating another structure of photo-sensing device, and FIG. 5B is a cross-sectional view of the photo-sensing device in FIG. 5A taken along a line C-C.

As shown in FIG. 5A, the photo-sensing device 10b differs from the photo-sensing device 10a shown in FIG. 4A in that the edges on the side of the optical sensing region 14a of the comb-shaped electrodes 17a and 18a are connected to each other, and that the connection wiring 19 is connected to the bottom end of the connecting portion 17b of the electrode 17 for the first low resistance semiconductor thin film.

In this case, the minimum unit of the optical sensing region 14a of the photoelectric conversion semiconductor thin film 14 is the opening area enclosed by each stripe electrode, namely comb-shaped electrodes 17 and 18. The area of the optical sensing region 14a of the photo-sensing device 10b can be increased by connecting the structure repeatedly in parallel as shown in the figure. As a result, in the photo-sensing device 10b, the area of the optical sensing region 14a of the photoelectric conversion semiconductor thin film 14 covered by the electrodes 17 and 18 for the first and the second low resistance semiconductor thin films decreases, thus increasing the area of the optical sensing region and enhancing sensitivity to light.

Transparent electrode materials may be used for the comb-shaped electrodes 17a and 18a. In this case, the amount of light received by the photoelectric conversion semiconductor thin film 14 of the photo-sensing devices 10a and 10b further increases, thus enhancing the sensitivity to incident light L.

The photo-sensing devices 10, 10a, and 10b are further constructed by providing the connection wiring 19 applied to TFT having an etching stopper type. In this case, large photocurrent is flown between the first electrode 12 and the connection wiring 19, which enhances the sensitivity to incident light L and allows downsizing.

By applying pulsed signals or AC voltage between the connection wiring 19 and the first electrode 12 of the photo-sensing devices 10, 10a, and 10b, pulsed or AC current is flown between the connection wiring 19 and the first electrode 12. Pulse current is flown in response to pulse signal input. Consequently, the amplitude of the output current from the photo-sensing devices 10, 10a, and 10b is modulated depending on the irradiation intensity of the incident light L into the photoelectric conversion semiconductor thin film 14. The equivalent circuits of the photo-sensing devices 10, 10a, and 10b are expressed as a circuit with the pin photodiode 35 and the capacitor 36 due to the insulating film 13 connected in series, or as the one with photoconductor 38 and the capacitor 36 due to the insulating film 13 connected in series. Since the capacitor 36 is connected in series, the direct current is not flown, but pulsed signal or AC current is flown. Consequently, the current that has undergone light modulation via the pin diode 35 or photoconductor 38 is flown through the photo-sensing devices 10, 10a, and 10b, which allows these devices to function as photo-sensing devices. Unlike the conventional TFT thin-film phototransistor 80, current also flows vertically across the pin junction of the photo-sensing devices 10, 10a, and 10b, which allows large current to be obtained, thus enhancing the sensitivity to incident light L while maintaining compactness.

Without departing from the scope of the present invention, the photo-sensing devices 10, 10a, and 10b can be executed in various embodiments. For example, the photo-sensing device 10 of the embodiment described above has the same structure as the etching stopper type TFT. However, it can have the same structure as a backchannel etching type TFT. In addition, the comb-shaped electrodes 17 and 18 for the first and the second low resistance semiconductor thin films can also be structured in an arbitrary shape, on condition that incidence area of the photoelectric conversion semiconductor thin film 14 can be ensured.

(Photosensor)

Hereinafter, a photosensor using the photo-sensing device of the present invention will be described.

Figure 6:
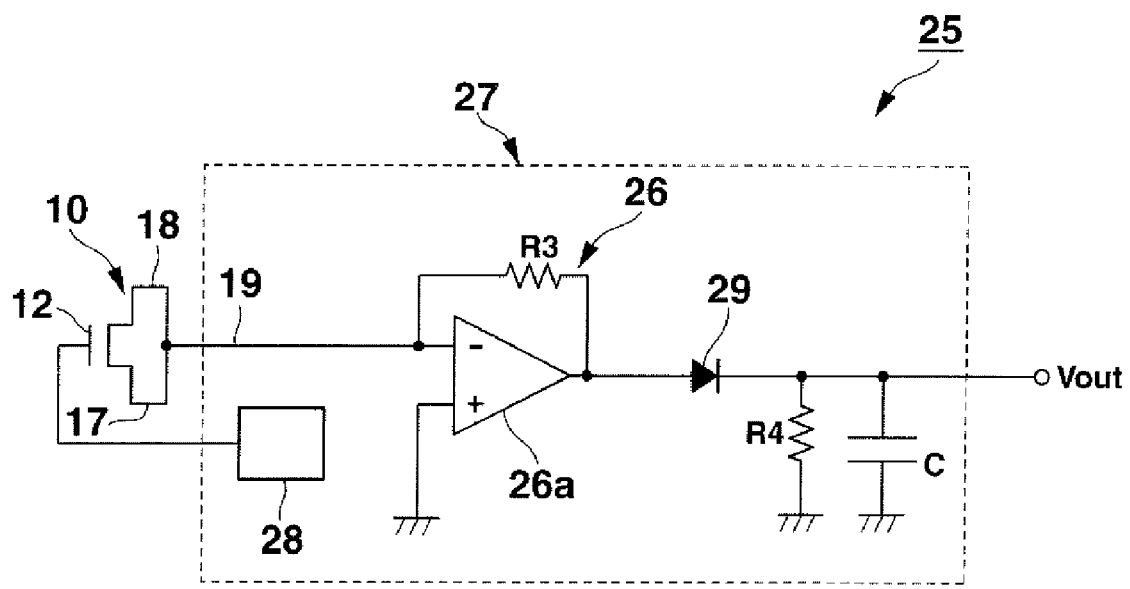
FIG. 6 is a block diagram illustrating a construction of a photosensor.

FIG. 6 is a block diagram illustrating a construction of a photosensor 25. As shown in FIG. 6, the photosensor 25 comprises a photo-sensing device 10 and an output signal processing circuit 27. The output signal processing circuit 27 in the figure includes an amplification circuit 26 to be connected to the photo-sensing device 10, a detection circuit 29 to be connected to the amplification circuit 26, and a pulse signal generation circuit 28 that generates pulse signal V and outputs the pulse signal to the first electrode 12 of the photo-sensing device 10. Incident light L is irradiated to the photo-sensing device 10 for detection. In this case, the pulse signal generation circuit 28 and the detection circuit 29 can be installed outside the photosensor 25 that uses the photo-sensing device 10.

The amplification circuit 26 is made of an operational amplifier 26a and provides a feedback resistor R3 connected between the noninverted input terminal and the output terminal. The amplification circuit 26 serves to convert current into voltage (hereinafter called as current-voltage conversion). The illustrated amplification circuit 26 uses one operational amplifier 26a. However, to obtain required voltage, another operational amplifier for voltage amplification can be connected in a later stage. The detection circuit 29, which includes diode D, resistor R5 and capacitor C, performs rectification.

The pulse signal generation circuit 28 generates pulse signals V, and outputs them to the first electrode 12 of the photo-sensing device 10.

According to using the above-mentioned output signal processing circuit 27, the compactness can be achieved owing to its simple structure including the amplification circuit 26 and the detection circuit 29 only, and the output current of the photo-sensing device 10 can be converted into voltage. The waveform of the pulse signals input from the pulse signal generation circuit 28 into the photo-sensing device 10 can be made of pulse waveform having peak to peak amplitude Vpp overlapped with the offset voltage consisting of negative DC voltage. One of the examples of this waveform is shown in FIG. 2C.

As shown in FIG. 2C, the cycle of the pulse waveform is the inverse of the repetition frequency f. This frequency f is called the drive frequency f of the pulse signal circuit. AC signals, or AC signals overlapped with offset voltage, may be used as pulse signals for a cycle control circuit. The AC signals include sine, triangular, and sawtooth waveforms and others. The signals output from the pulse power supply 21 and the pulse signal generation circuit 28 of the present invention are those other than DC signals. The pulse signals of the present invention mean AC signals.

The photosensor 25 using a photo-sensing device 10 allows the output current, Iout, from the connection wiring 19 to be converted to voltage in the amplification circuit 26 of the first stage, and the output voltage, Vout, of the detection circuit 29 becomes the voltage corresponding to the illumination signals through the detection performed in the detection circuit 29.

The method of applying pulse signals to the connection wiring 19 and the first electrode 12 of a photo-sensing device 10 in a photosensor 25 is described below.

Figure 7A:
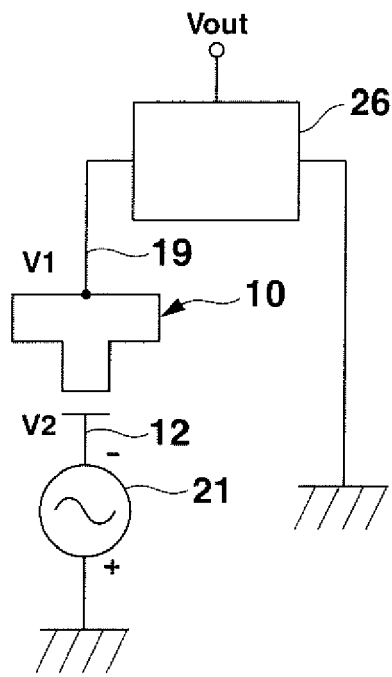
FIG. 7A is a circuit diagram illustrating a method of applying pulse signals to a photo-sensing device.
Figure 7B:
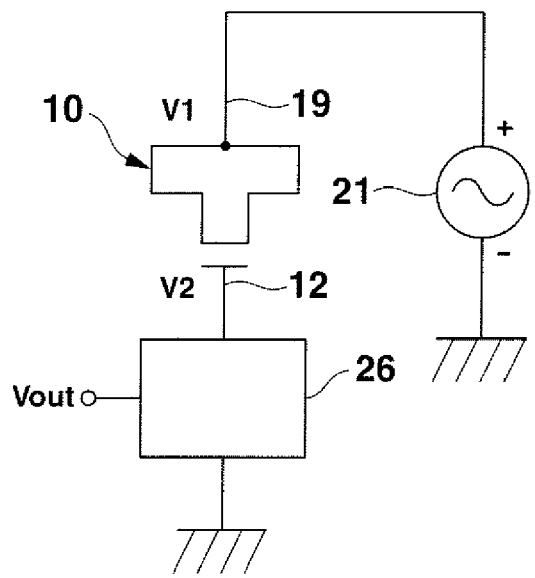
FIG. 7B is a circuit diagram illustrating a method of applying pulse signals to a photo-sensing device.
Figure 7C:
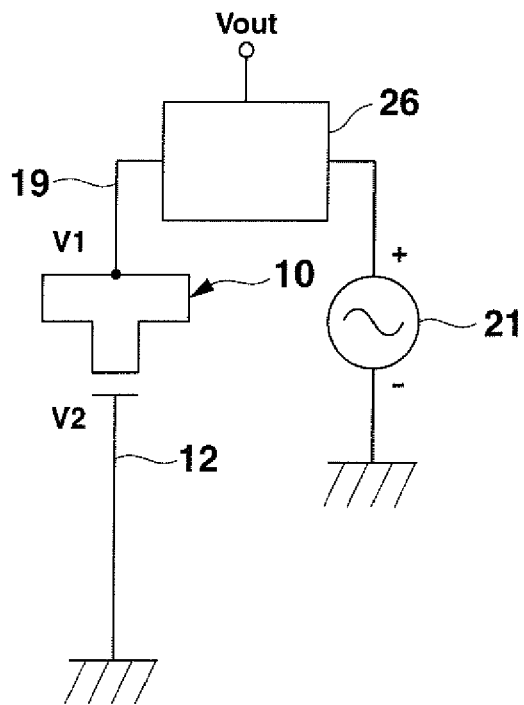
FIG. 7C is a circuit diagram illustrating a method of applying pulse signals to a photo-sensing device.

FIGS. 7A, 7B, and 7C are circuit diagrams illustrating the method of applying pulse signals to the photo-sensing device 10. The example as shown in FIG. 7A uses the same pulse signal application method as the photosensor 25 in FIG. 6. Specifically, one end of the pulsed power supply 21 is connected to the first electrode 12, and the other end of the pulsed power supply 21 is grounded. Meanwhile, the connection wiring 19 of the photo-sensing device is grounded via a current measurement means. The current-voltage conversion circuit 26 as shown in FIG. 6 can be used as the current measurement means, for example.

In the example shown in FIG. 7B, one end of the pulsed power supply 21 is connected to the first electrode 12 of the photo-sensing device 10, and then grounded via the current-voltage conversion circuit 26. Meanwhile, the connection wiring 19 of the photo-sensing device 10 is connected to one end of the pulsed power supply 21, and the other end of the pulsed power supply 21 is grounded.

In the example as shown in FIG. 7C, the connection wiring 19 of the photo-sensing device 10 is connected to one end of the pulsed power supply 21 via the current-voltage conversion circuit 26, and the other end of the pulsed power supply 21 is grounded. Meanwhile, the first electrode 12 of the photo-sensing device 10 is grounded.

The above-mentioned methods of connecting the pulsed power supply 21 and the current-voltage conversion circuit 26 to the photo-sensing device 10 are typical examples. The method of connecting the pulsed power supply 21 and the current-voltage conversion circuit 26 can be selected as required depending on the purpose of use of the photosensor 25.

By using the above photosensor 25, application of pulsed signals or AC signals between the connection wiring 19 and the first electrode 12 of the photo-sensing device 10 allows pulse current corresponding to the incident light L to be output from the photo-sensing device 10 owing to the electric field effect. The outputted current is then amplified into voltage via the output signal processing circuit 27. Illumination signals corresponding to the irradiation intensity of the incident light L can be obtained by extracting the effective value, minimum peak value, etc. of this voltage.

(Typical Embodiments of the Photosensor 25)

As a typical construction 1 of a photosensor, the case that the photo-sensing device 10b shown in FIG. 5A is used will be described more in detail below.

The photo-sensing device 10b was manufactured as follows.

A 100 nm-thick AlNiTi first electrode 12 was deposited on a glass substrate 11 and 120 nm-thick SiN insulating film 13 was deposited onto the glass substrate 11 by the plasma CVD method. A 25 nm-thick photoelectric conversion semiconductor thin film 14, and then 400 nm-thick optical sensing region passivation film 15 were deposited onto the insulating film 13, a 25 nm-thick low resistance semiconductor thin film 16 was formed, and then electrodes 17 and 18 for the first and the second low resistance semiconductor thin films and connection wiring 19 including a connecting portion 19a were formed with a 140 nm-thick Cr metal layer.

The photo-sensing device 10b was formed that the optical sensing regions 14a as many as 250 portions were formed within the 2 mm×2 mm range and the area of one of the optical sensing region 14a becomes 4 μm×4 μm. Specifically, comb-shaped electrodes 17a and 18b were formed that 250 pieces of grids were fabricated with the comb-shaped electrodes 17a and 18b for one first electrode 12. Furthermore, 250 such the optical sensing regions were arranged in parallel within the 2 mm×2 mm range to be the photo-sensing device 10b. The total area of the optical sensing region 14a was therefore calculated to be 1 mm$^2$.

Figure 8A:
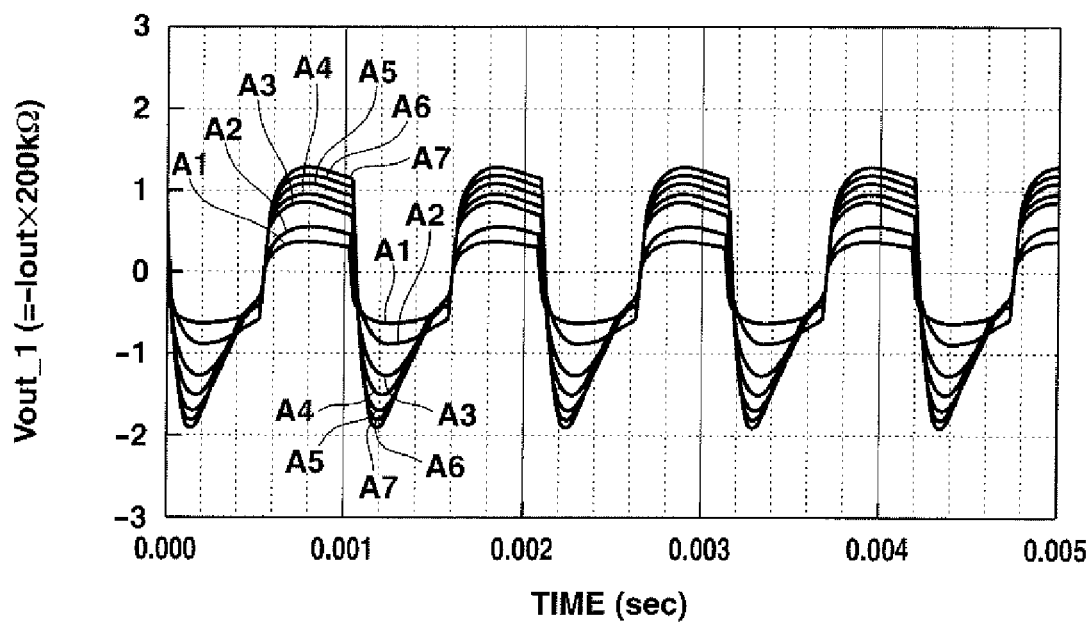
FIG. 8A is a chart illustrating the output voltage of an amplification circuit of the photosensor in FIG. 6 as amplification characteristic exhibited when an incident light L is irradiated to the photo-sensing device.
Figure 8B:
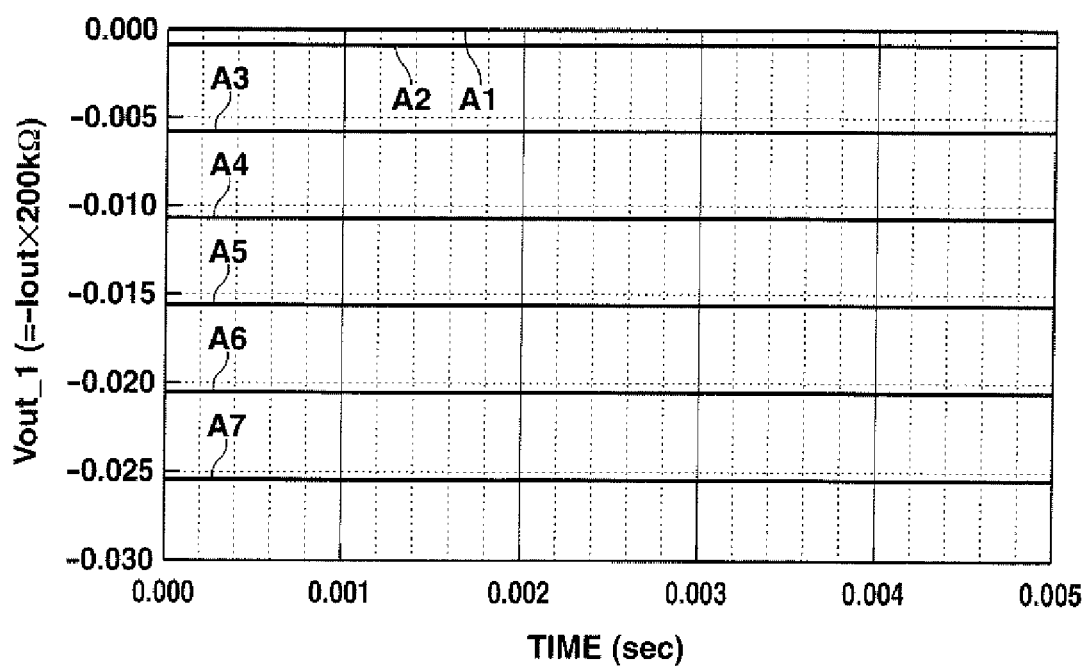
FIG. 8B is a chart illustrating the output voltage when a thin film phototransistor is DC driven.

FIG. 8A is a chart illustrating the output voltage of the amplification circuit 26 of the photosensor 25 in FIG. 6 as amplification characteristics exhibited when an incident light L is irradiated to these photo-sensing device 10b. FIG. 8B is a chart illustrating the output voltage when a thin-film phototransistor is DC driven. In FIGS. 8A and 8B, signs A1, A2, A3, A4, A5, A6, and A7 represent the intensity of irradiation of the incident light L, specifically, the output voltage when the illuminance was 0, 46, 293, 541, 789, 1035, and 1282 lx, respectively.

As shown in FIG. 8A, pulse signals (Voffset=−5V, Vpp=5 V, f=960 Hz) were applied to the first electrode 12, with the feedback resistor R4 of the amplification circuit 26 maintained at 200 kΩ. In this case, the output voltage of the amplification circuit 26 was found to have pulsed waveforms, which indicates that the output voltage had been modulated according to the illuminance of the incident light L.

The above output voltage was then detected using the detector circuit 29. The resistor R5 of 1 MΩ and capacitor C of 100 nF were used for the detector circuit 29. In this case, the time constant T of the detector circuit 29 was calculated to be 0.1 sec, i.e. T=R5×C=0.1. When the time constant T is made excessively large, the sensitivity to the change of intensity of incident light L decreases. On the other hand, if the time constant T is made excessively small, the critical frequency as low-pass filter increases. In this case, the drive frequency f, frequency of the pulse signals, must be increased to high. By maintaining the time constant at 0.1 sec., the satisfactory response speed was obtained. Consequently, sufficient DC output was obtained from the detector circuit 29 when the drive frequency f was kept at 960 Hz.

Figure 17A:
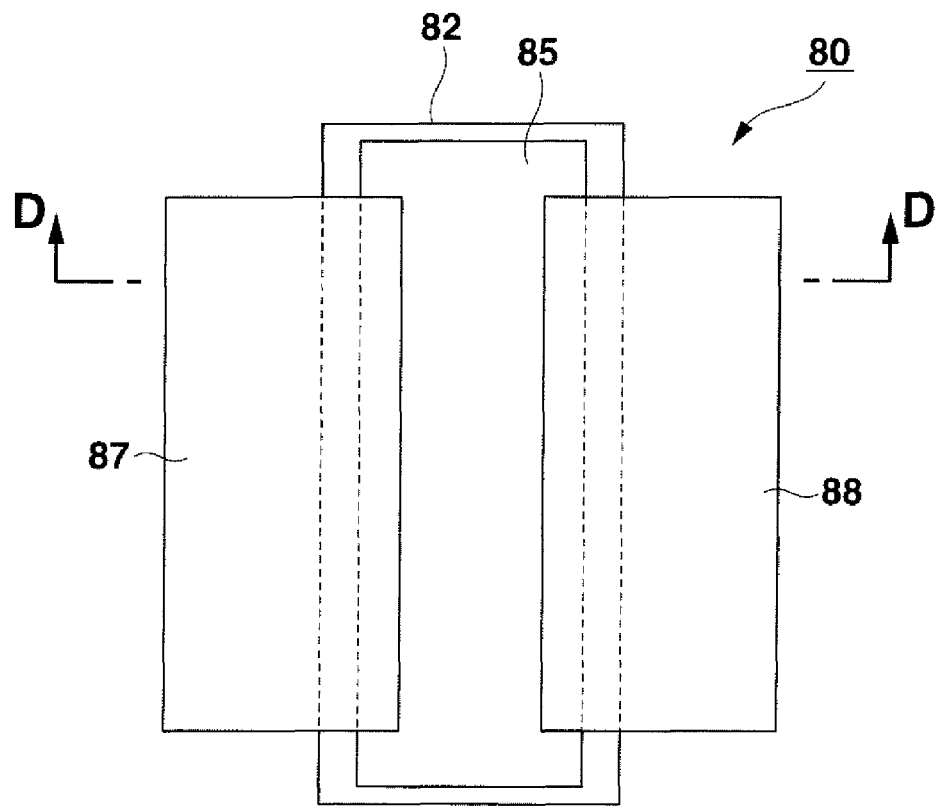
FIG. 17A is a perspective plan view illustrating a structure of a conventional thin-film phototransistor.
Figure 17B:
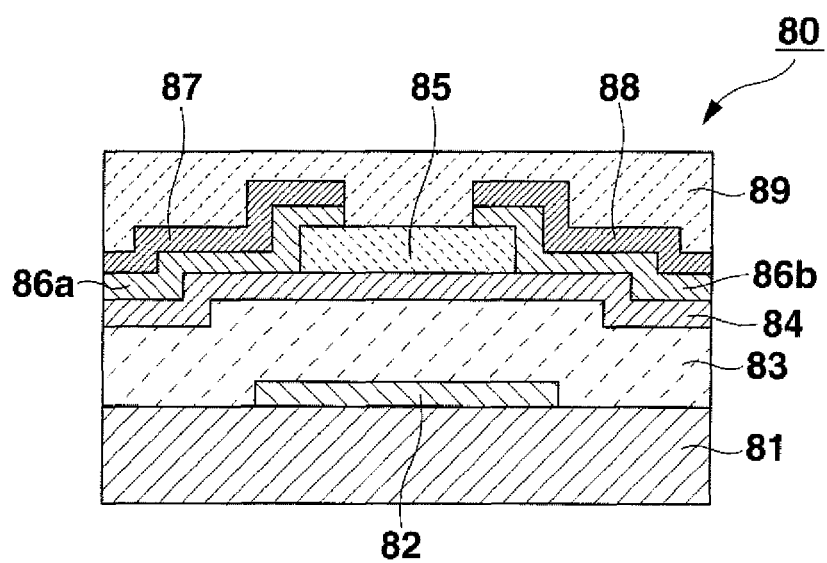
FIG. 17B is a cross-sectional view of the thin-film phototransistor in FIG. 17A taken along a line D-D.
Figure 18:
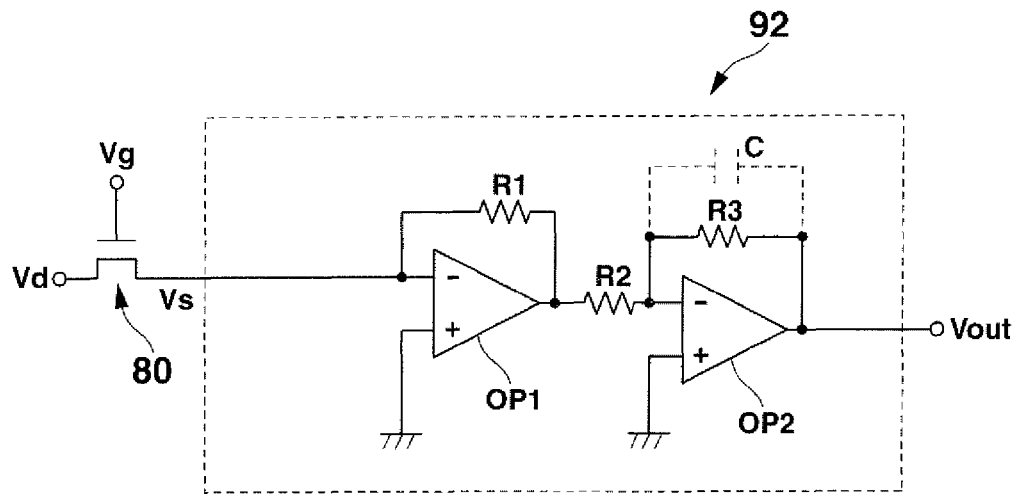
FIG. 18 is a typical circuit diagram illustrating a construction of a photosensor using the thin-film phototransistor in FIGS. 17A and 17B.
Figure 19A:
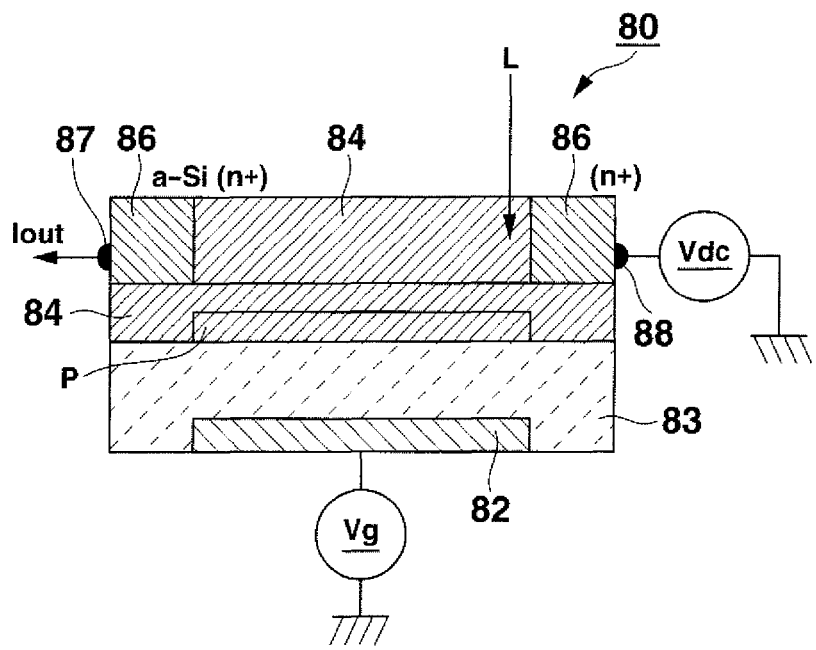
FIG. 19A is a schematic cross-sectional view illustrating the operation of a thin-film phototransistor.
Figure 19B:
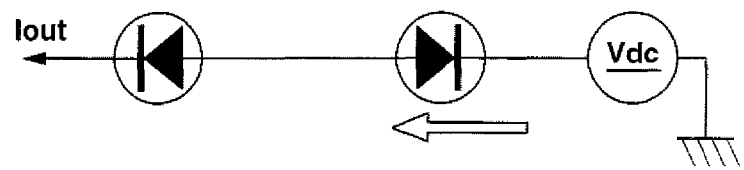
FIG. 19B is an equivalent circuit diagram of a thin-film phototransistor.
Figure 20:
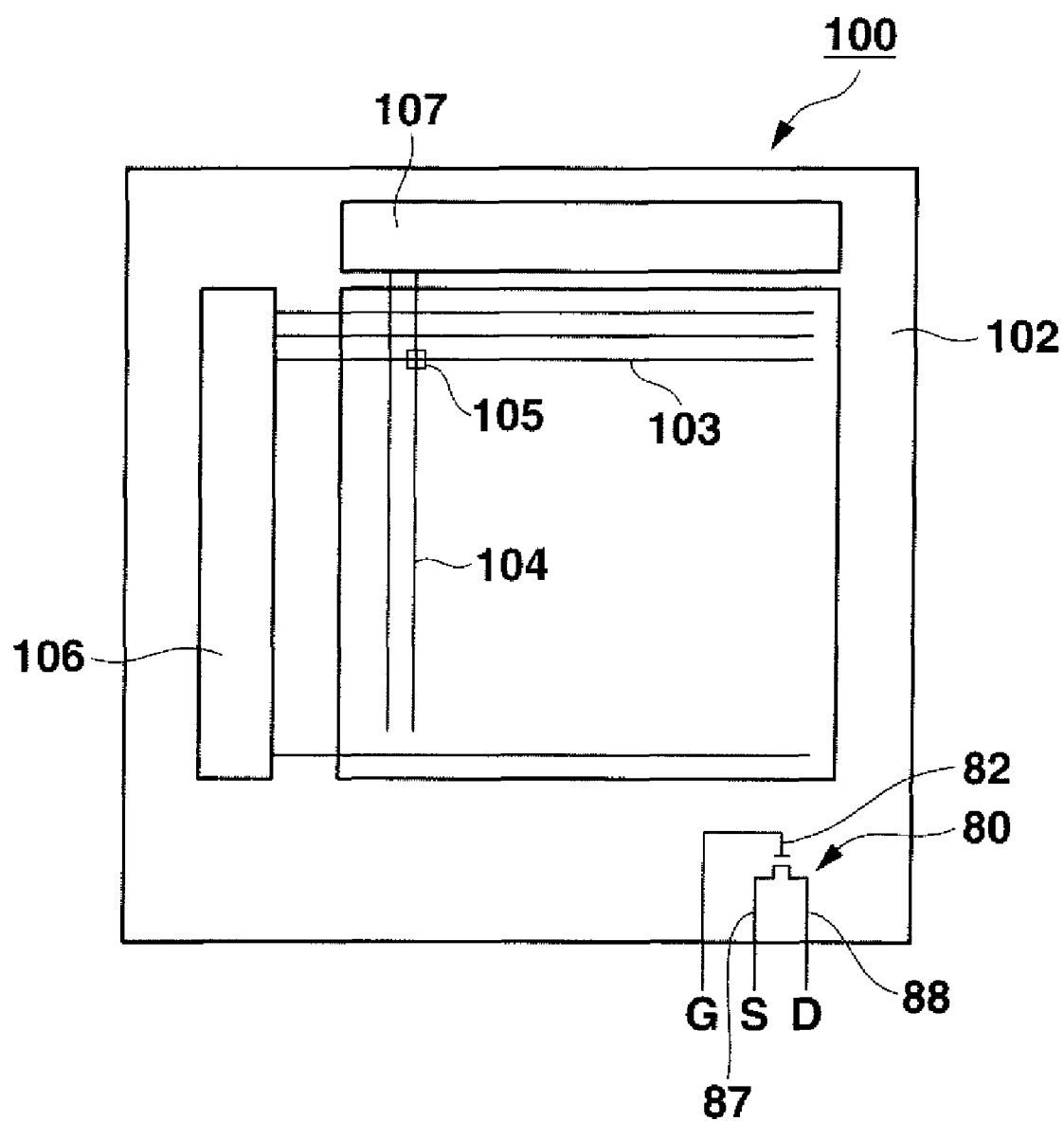
FIG. 20 is a schematic plan view of a typical display device equipped with a conventional thin-film phototransistor.

FIG. 8B illustrates the output voltage, Vout, obtained by DC drive (Vd=4 V, Vg=−0 V) by the thin-film phototransistor 80 as shown in FIG. 17 formed in the same size.

It is obvious that the output voltage of the photo-sensing device 10b of the present invention is in the order of 1 V, whereas that of the DC-driven thin-film phototransistor 80 is in the order of −0.01 V in comparison between FIG. 8A and FIG. 8B. This difference in two orders demonstrates that the sensitivity of the photo-sensing device 10b of the present invention is significantly higher than that of conventional phototransistors.

(Variations of the Photosensor)

Hereinafter, other preferred embodiment of the photosensor will be described.

Figure 9:
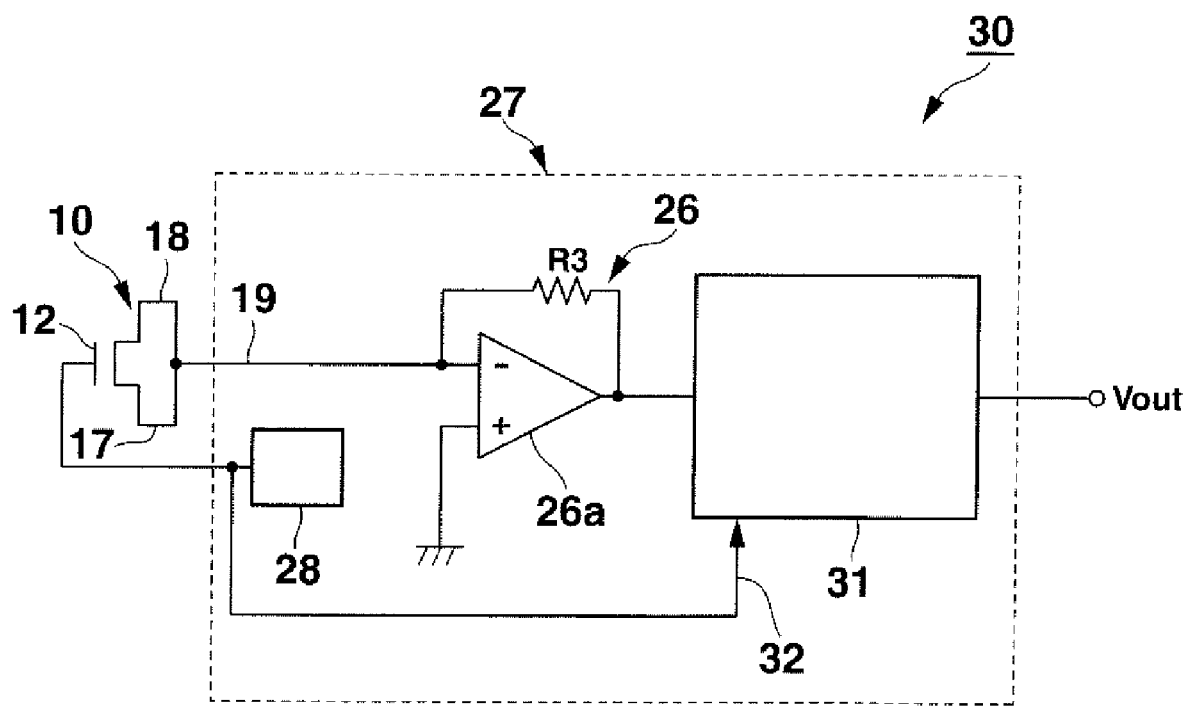
FIG. 9 is a block diagram illustrating another construction of a photosensor using a photo-sensing device in FIG. 1.

FIG. 9 is a block diagram illustrating another construction of a photosensor using the photo-sensing device 10 as shown in FIG. 1A, for example. The photosensor 30 is the same as the photosensor 25 as shown in FIG. 6 except that an AD conversion circuit 31 is provided instead of the detector circuit 29. In the AD conversion circuit 31, pulse signals are input as trigger signals 32 from the pulse signal generation circuit 28 connected to the first electrode 12 of the photo-sensing device 10, which allows the AD conversion circuit 31 to perform accurate timing control based on the trigger signals 32. In this case, the AD conversion circuit 31 may be installed outside the photosensor 30 as in the case of the detector 29.

Specifically, the AD conversion circuit 31 generates digital output by sampling the value obtained when specified period of time from the rising or the falling of trigger signals has elapsed. In either of the cases, the AD conversion circuit 31 can obtain digital output that changes monotonously in response to the change of illuminance, thus performing good illuminance detection.

The AD conversion circuit 31 can also output the value as an illuminance signal so as to detect the maximum or the minimum peak value from the sampled data values obtained within the specified period of time.

The AD conversion circuit 31 can also calculate an effective value (i.e. square root of the square mean value of the sampling values) of the sampled data. The load on the processing system is large in the calculation of the effective value. However, since data processing is performed for multiple points, and not for only one point, the effect of random error i.e. random noise is minimized, and thus illuminance can be detected more accurately.

In the photosensor 30, the AC conversion circuit 31 fetches illuminance signals by directly performing AD conversion of the output voltage. Consequently, the configuration of the output signal processing circuit 27 can be made simple, and in addition, the pulse signals enter into the AD conversion circuit 31 as trigger signals. Therefore, timing pulses need not be generated separately and the configuration of the photosensor 30 is further simplified.

The photosensor 30 does not use a detector circuit 29, but processes the output voltage from the amplification circuit 26 directly in the AD conversion circuit 31. This configuration is advantageous because there is no data delay due to so-called RC time constant by resistor R4 in the detector circuit 29 and capacitor C used in the photosensor 25. With devices that integrate AD conversion and numeric operation function such as mobile phones and digital cameras, use of existing functions prevents increase in cost.

(Embodiments of Photosensor 30)

By using the photo-sensing device 10b shown in FIG. 5A, a photosensor 30 shown in FIG. 9 was assembled. The photosensor 30 is the same as the photosensor 25 except that an AD conversion circuit 31 (WE7272, Yokokawa Electric Corporation) was used instead of the detector circuit 29.

Figure 10:
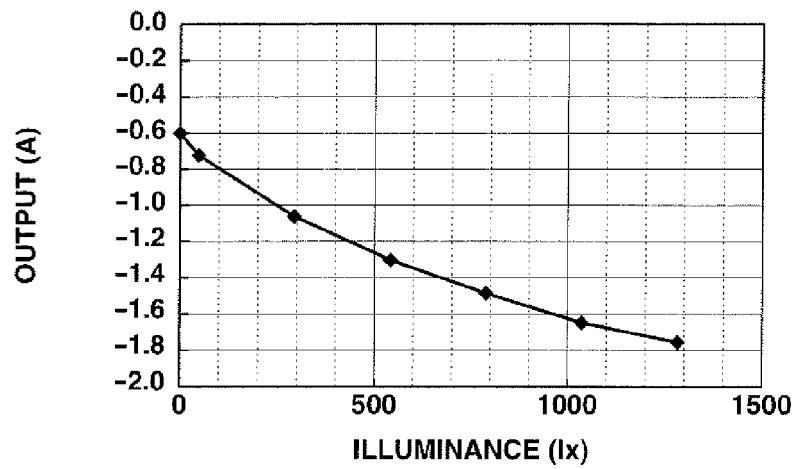
FIG. 10 is a chart illustrating digital output of the AD conversion circuit of the photosensor in FIG. 9 that the AD conversion is executed after 0.1 μsec. standby time following the detection of the rising of a trigger signal.

FIG. 10 is a chart illustrating digital output of the AD conversion circuit 31 of the photosensor in FIG. 9 that the AD conversion is executed after 0.1 μsec. standby time following the detection of rising of a trigger signal.

Figure 11:
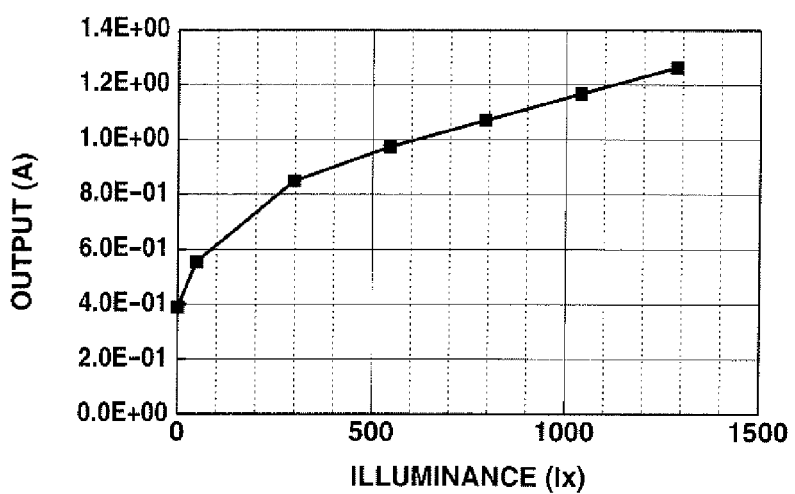
FIG. 11 is a chart illustrating digital output of the AD conversion circuit of the photosensor in FIG. 9 that the AD conversion is executed after 0.2 sec. standby time following the detection of the falling of a trigger signal.

FIG. 11 is a chart illustrating digital output of the AD conversion circuit of the photosensor in FIG. 9 that the AD conversion is executed after 0.1 μsec. standby time following the detection of falling of a trigger signal. In either of the cases, the AD conversion circuit 31 was able to perform favorable illuminance detection by obtaining digital output, which changes monotonously in response to the change of illuminance.

Figure 12:
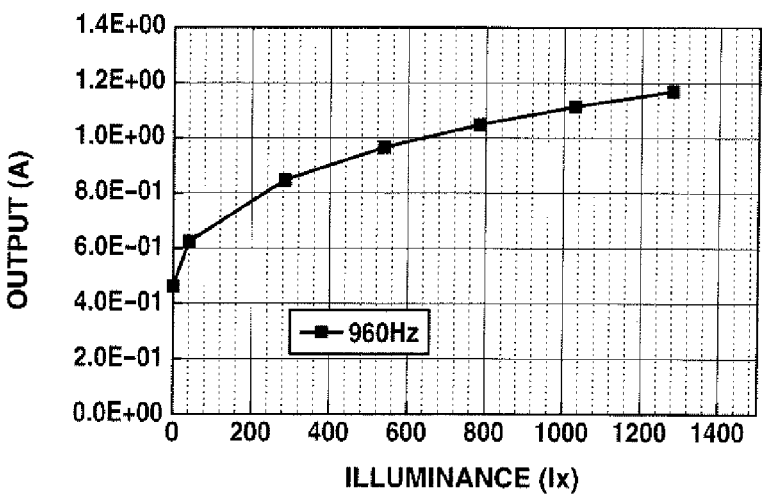
FIG. 12 is a chart illustrating the actual output value calculated based on the sampling data of the AD conversion circuit of the photosensor in FIG. 9.

FIG. 12 is a chart illustrating the actual effective output value calculated based on the sampling data of the AD conversion circuit of the photosensor 30 in FIG. 9. The pulse voltage to be applied to the photo-sensing device 10b is the same as the case in FIG. 8. In this case, since the pulse frequency was 960 Hz, the effective value was calculated using the sampling data obtained in the period of 1/960 Hz (1.04 msec.). Since sampling frequency was maintained at 100 kHz, the number of data points sampled in that period was calculated to be 104 points (1.04 msec.×100 kHz=104). In this case also, good illuminance detection was performed by obtaining the output that changed monotonously in response to the change of illuminance.

The frequency dependency of the AD conversion circuit 31 that appears when the effective value and the minimum peak value of the sampling data are extracted will be described below.

Figure 13:
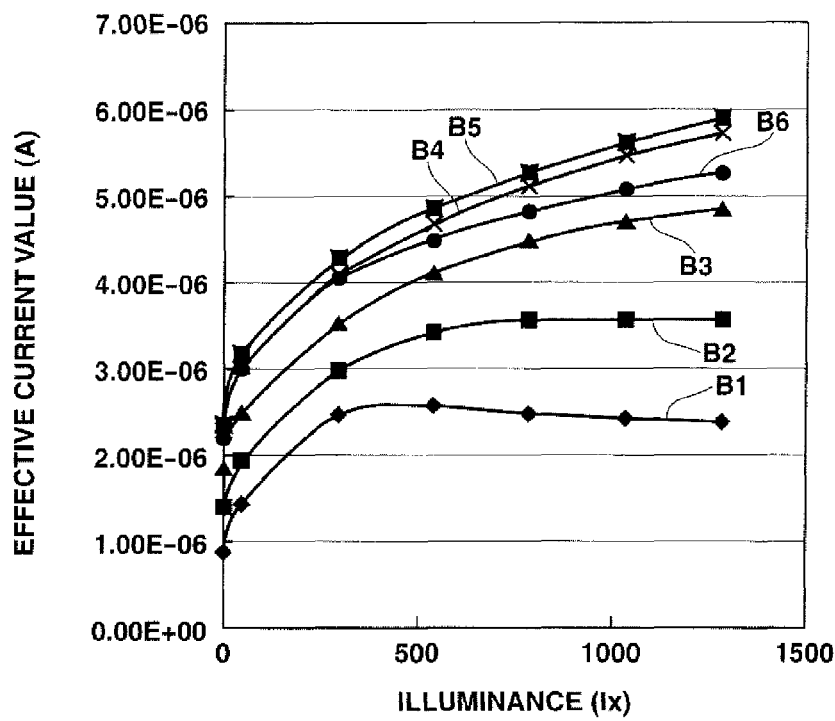
FIG. 13 is a chart illustrating the frequency dependency of the effective value calculated based on the sampling data of the AD conversion circuit of the photosensor in FIG. 9.

FIG. 13 is a chart illustrating the frequency dependency of the effective value calculated based on the sampling data of the AD conversion circuit 31 of the photosensor 30 in FIG. 9. FIG. 13 illustrates the effective current value for each illuminance, with signs B1, B2, B3, B4, B5, and B6 demonstrating the results obtained when the drive frequency of each pulse signal was 60, 120, 240, 480, 960, and 1920 Hz respectively. The chart indicates that the sensitivity of the effective current value is the highest when the drive frequency f was 960 Hz. In the case, when the drive frequency f was 60 Hz, inversion of effective current value occurred when the illuminance was several hundred 1x or higher. This is because that with the increase of illuminance, the peak value also increased. However, the time constant decreased at the same time, thus it is considered that the peak relaxation time is shortened.

Figure 14:
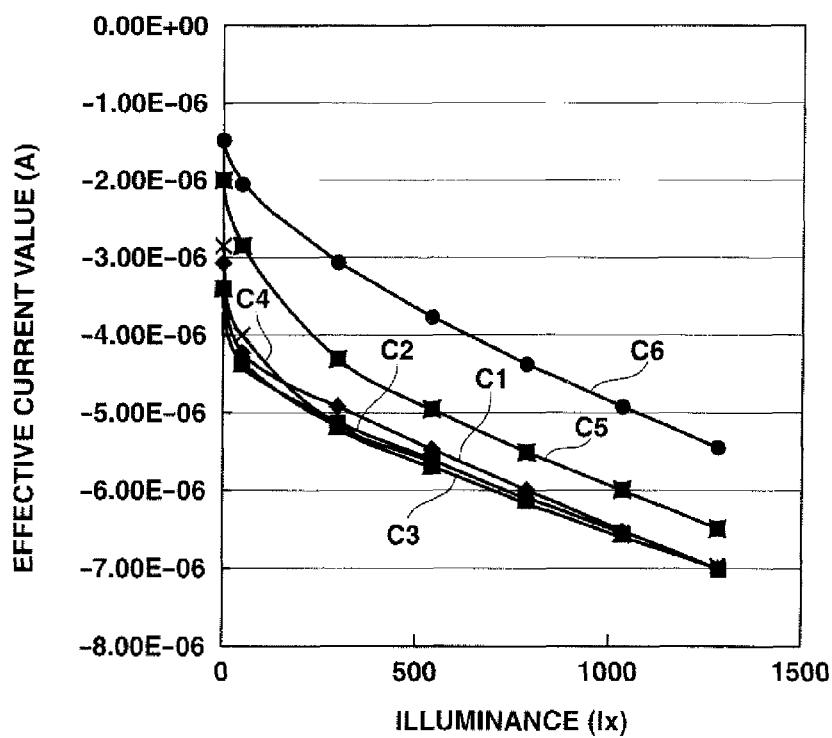
FIG. 14 is a chart illustrating the frequency dependency of the minimum peak value calculated based on the sampling data of the AD conversion circuit of the photosensor in FIG. 9.

FIG. 14 is a chart illustrating the frequency dependency of the minimum peak value calculated based on the sampling data of the AD conversion circuit 31 of the photosensor 30 in FIG. 9. FIG. 14 illustrates the minimum current peak values for each illuminance, with signs C1, C2, C3, C4, C5, and C6 demonstrating the results obtained when the frequency of the trigger signal 32 was 60, 120, 240, 480, 960, and 1920 Hz respectively. When the frequency of the trigger signal 32 was 480 Hz or lower, the sensitivity was maintained high and at constant level. Even if the frequency of the trigger signal 32 were 60 Hz or lower, the same result would be obtained, with no limitation imposed on the low-frequency side.

The response waveform of the above current was asymmetric when the first electrode 12 was ON (plus side) and OFF (minus side), because the resistance of the optical sensing region 14a decreased when the first electrode 12 was OFF, requiring longer time for response and relaxation. Consequently, if gate signals of the display device to be explained later are to be used as trigger signals 32, the ON voltage further increases, and as a result asymmetry becomes more prominent. From this, it is apparent that the response time of the photo-sensing device 10 is limited based on the time constant when the first electrode 12 is set to OFF. If OFF time only is taken into consideration, 30-Hz duty is equivalent to 50% of the gate signal (60 Hz) of the display device. The value 30 Hz is significantly lower than 480 Hz, which is the upper limit of the frequency having high sensitivity described using FIG. 14. Therefore, accurate illuminance signals can be obtained by applying gate signals for the display device to the first electrode 12 of the photo-sensing device 10, thus extracting the minimum peak value of the output.

(Display Device)

Hereinafter, display devices are described.

Figure 15A:
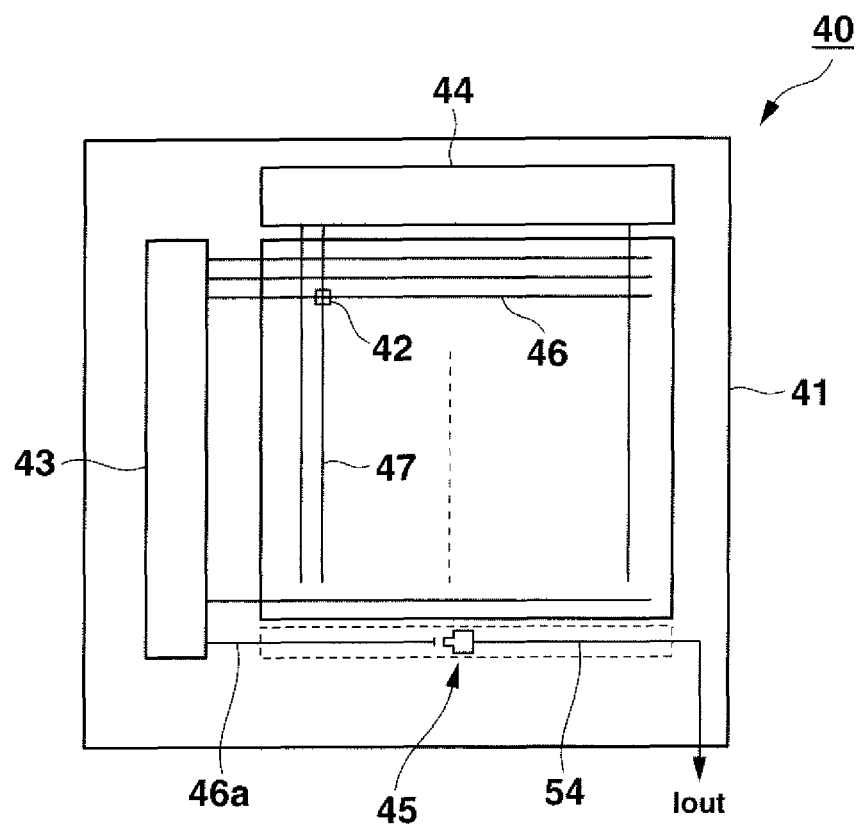
FIG. 15A is a schematic plan view illustrating a construction of a display device.
Figure 15B:
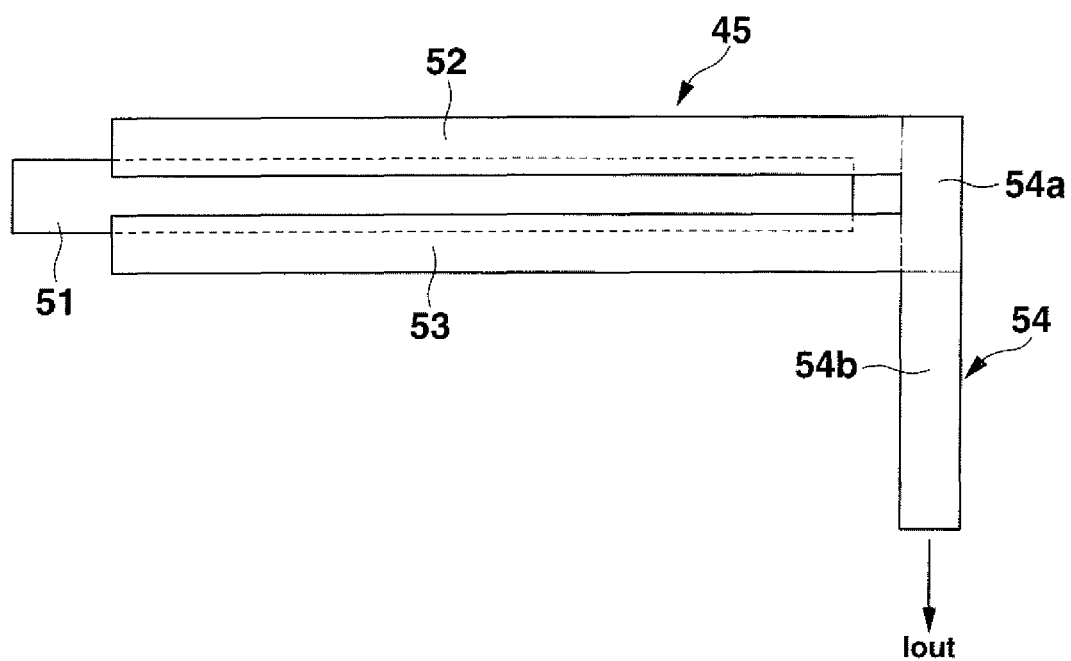
FIG. 15B is a magnified plan view of a photo-sensing device.

FIG. 15A is a schematic plan view illustrating a construction of a display device 40, and FIG. 15B is a magnified plan view of a photo-sensing device 45.

As shown in FIG. 15A, the display device 40 comprises a substrate 41 made of a transparent material such as glass, a pixel display part 42, a gate driver 43 and a data driver 44 that drive the TFT located at each pixel, and a photo-sensing device 45 provided adjacent to the bottom side of the pixel display part 42. Each component comprised of the pixel display part 42, the gate driver 43, the data driver 44, and the photo-sensing device 45 is provided on the substrate 41, and these components are fabricated by using the thin film manufacturing process.

The gate electrodes of the TFTs providing to one row are all connected to a single gate line, thereby being connected to each other. Thus, the gate electrode wirings in rows are connected to plural gate lines 46 that extend on the surface of the pixel display part 42 horizontally in parallel to each other. The source electrodes of the TFTs providing to one column are all connected to a data line, thereby being connected to each other. Thus, the source electrode wirings in columns are connected to plural data lines 47 that extend on the surface of the pixel display part 42 vertically in parallel to each other. The pixels of the pixel display part 42 are arranged in a matrix of rows and columns so-called XY matrix at the cross-sectional regions of the gate lines 46 and data lines 47.

As shown in FIG. 15A, one end of each gate line 46, i.e. the left end, is connected to the gate driver 43, which supplies gate signals sequentially. One end of each data line 47, the top end in the case of FIG. 15A, is connected to the data driver 44, which supplies data signals sequentially.

In this case, the gate driver 43 and the data driver 44 sequentially transmit gate signals and data signals respectively to each gate line 46 and each data line 47, thus controlling the drive of each pixel of the pixel display part 42 and allowing the entire pixel display part 42 to provide dot matrix display. Liquid crystal or organic EL materials can be used for the pixel display part.

The pixel display part 42 is configured as a TFT liquid crystal display part for example, and is served as luminescent display by applying drive voltages via corresponding gate lines 46 and data lines 47. Furthermore, the pixel display part 42 is illuminated by the backlight part (not shown) from the rear side.

As shown in the magnified view of FIG. 15B, the photo-sensing device 45 has the same configuration as the photo-sensing device 10 shown in FIG. 1A, for example, and is provided with a first electrode 51 and a connection wiring 54. The right ends of the electrodes 52 and 53 for the first and the second low resistance semiconductor films are short-circuited by the connecting portion 54a of the connection wiring 54. When the electrodes 52 and 53 for the first and the second low resistance semiconductor thin films are formed, the photo-sensing device 45 is formed on the substrate 41 simultaneously with the TFT, which is fabricated on each pixel of the pixel display part 42 of the display device 40.

The photo-sensing device 45 is formed along and in parallel to the gate line 46, and the left end of the first electrode 51 is connected to the gate line 46a placed at the far bottom.

The connection wiring 54, which short-circuits the electrodes 52 and 53 for the first and the second low resistance semiconductor thin films of the photo-sensing device 45, extends up to the edge of the substrate 41 along the wiring pattern (not shown), and the output current, Iout, is output at the time of irradiation of light.

Specifically, the channel length of the photo-sensing device 45 is set to 7 μm for example, and the gate width of the photo-sensing device 45 is approximately 20 cm which corresponds to the to the width of the display device when the display device 40 is a so-called medium-size panel.

Thus, the gate signals coming from the gate driver 43 are input into the first electrode 51 of the photo-sensing device 45 via the gate line 46a, and the output current, Iout, from the connection wiring 54 is output to outside.

According to the display device 40 in this embodiment, the gate driver 43 and the data driver 44 transmit gate signals and data signals to each gate line 46 and data line 47 based on the image signals input from outside, thus controlling the drive of the pixel display part 42 and providing image display.

In the photo-sensing device 45 provided within the display device 40, the gate driver 43 transmits pulse signals to the first electrode 51 of the photo-sensing device 45 via the gate line 46a, and thus the photo-sensing device 45 outputs the output current, Iout, corresponding to the intensity of the incident light L. Consequently, by processing the output current, Iout, to current-voltage conversion by the photosensors 25 and 30 shown in FIG. 6 and FIG. 9, for example, and processing detection or AD conversion, illuminance signals corresponding to the intensity of the incident light L can be obtained. Based on this illuminance signal, the drive of the backlight of the display device 40 is controlled, which ensures illumination with the backlight having the intensity corresponding to the brightness of the surrounding area, thus providing an eye-friendly display. The display status of the pixel display part 42 can thus be adjusted using the photosensor 25 or 30.

In this case, since the photo-sensing device 45 is operated in the same manner as the photo-sensing device 10 shown in FIG. 1A, for example, its illuminance signals can be be obtained much larger than those obtained when thin film phototransistor 80 is DC driven. Thus, the sensitivity to incident light L enhances significantly and it is possible to detect highly accurate illuminance. Furthermore, since the photo-sensing device 45 can be made by the same manner as the TFTs comprising the pixel display part 42, it can be fabricated onto the substrate 41 in compact size simultaneously by the same processes of TFTs.

In addition, the photo-sensing device 45 is provided along the bottom edge of the display screen along the gate line 46a, which makes it unnoticeable. Furthermore, since the photo-sensing device 45 has the long and thin shape, its output current (Iout) does not fluctuate much even if a human hand is placed carelessly around the display, for example. Thus, the malfunction can be suppressed to occur. Here, the gate signals are rectangular signals having the frequency of 60 Hz and duty of approximately 250 to 500 in general. Such pulse signals drive the photo-sensing device 45 to obtain large output current, Iout.

In this case, since the capacity obtained with the insulating films and others (not shown) is approximately 0.14 fF/μm, the time constant, which is determined based on this capacity and the resistance of the optical sensing region 14a at OFF, can be estimated to be approximately 1 ms. Therefore, the duration in which gate signals are OFF must be kept at 1 ms or longer for the photo-sensing device 45 to give full response, thus ensuring desirable sensitivity. The conventional gate signals satisfy this requirement.

The amplitude of pulse signals, namely AC signals, to be applied to the first electrode 51 of the photo-sensing device 45 is determined by gate signals, and the central value of the amplitude is determined by Voffset. Generally, Voffset is set at the ground level of the gate driver 43 for the convenience. However, it is made easy that the Voffset can be set at DC voltage that is not at the ground level to obtain optimum output. Furthermore, if the gate signal does not have the pulse width required for the pulse signal to be applied to the first electrode 51 of the photo-sensing device 45, it is possible that the gate signals from the consecutive two or more gate lines 46 can be taken out and synthesized to obtain pulse signals having desired pulse width.

When the first electrode 51 of the photo-sensing device is connected to the gate line 46 of the gate driver 43, the gate driver 43 currently in use can be applied to drive the photo-sensing device 45.

The gate driver may be provided with an exclusive gate line 46 for the photo-sensing device 45. In this case, the gate line 46 is connected to the first electrode 51 of the photo-sensing device 45, and it is possible that the photo-sensing device 45 can be driven in a simple configuration. This embodiment allows the photo-sensing device 45 to be driven with the exclusive gate line 46 for the photo-sensing device 45.

When the photo-sensing device 45 is provided adjacent to the outermost side of one of the edges of the gate lines 46, the photo-sensing device 45 can be placed on the substrate 41 of the display device 40 accurately and easily, even if the interval between gate lines 46 is small.

If the photo-sensing device 45 is formed long and thin along the gate lines 46, covering the entire region where the data lines 47 are provided, the area of the photoelectric conversion semiconductor thin film (not shown) for which incidence is allowed increases. Thus, the output current, Iout, of the photo-sensing device 45 also increases, thereby enhancing the sensitivity to the incident light L.

In the above embodiment, even if the interval between the gate lines 46 is small, the photo-sensing device 45 can be provided on the substrate 41 of the display device 40 accurately and easily. In addition, since the incidence area increases, the output current, Iout, of the photo-sensing device 45 also increases, thus enhancing the sensitivity to the incident light L.

In the display device 40, if pulse signals are applied to the first electrode 51 of the photo-sensing device 45, the electric field effect allows pulse current corresponding to the incident light L to be output from the connection wiring 54. The illuminance signals corresponding to the intensity of the incident light L can be obtained by processing this output current, Iout, to voltage amplification with photosensor 25 or 30, and extracting the effective value or the minimum peak value of the output current, Iout, with a detector circuit 29 or AD conversion circuit 31.

According to the display device 40, by applying pulse signals to the connection wiring 54 and the first electrode 51 of the photo-sensing device 45, the photo-sensing device 45 is driven by AC current, and the current flows in the optical sensing region vertically between the connection wiring 54 and the first electrode 51, thereby allowing large output current, Iout, to be obtained and thus enhancing the sensitivity to the incident light L. Consequently, since the photo-sensing device 45 ensures sufficiently large output current, Iout, the illuminance signals corresponding to the intensity of the incident light L can be obtained accurately even in a dark place of 20 1x or lower, thereby allowing the intensity of the backlight part to be adjusted.

According to the display device 40, by applying signals corresponding to the gate signals for drive control of each pixel display part 42 between the connection wiring 54 and the first electrode 51 of the photo-sensing device 45, illuminance signals corresponding to the intensity of the incident light L coming into the display device 40 are output from the photo-sensing device 45. Consequently, the gate driver 43 currently in use can be applied to drive the photo-sensing device 45. In this case, since pulse signals corresponding to gate signals are applied to the photo-sensing device 45, large output current corresponding to the incident light L can be output. Since the sensitivity of the photo-sensing device 45 to light thus increases, illuminance signals corresponding to the incident light L can be obtained even in a dark place. Therefore, the drive control of the backlight part of the display device, namely adjustment of light, can be possible even within an unilluminated room.

(Variations of the Display Device)

Figure 16A:
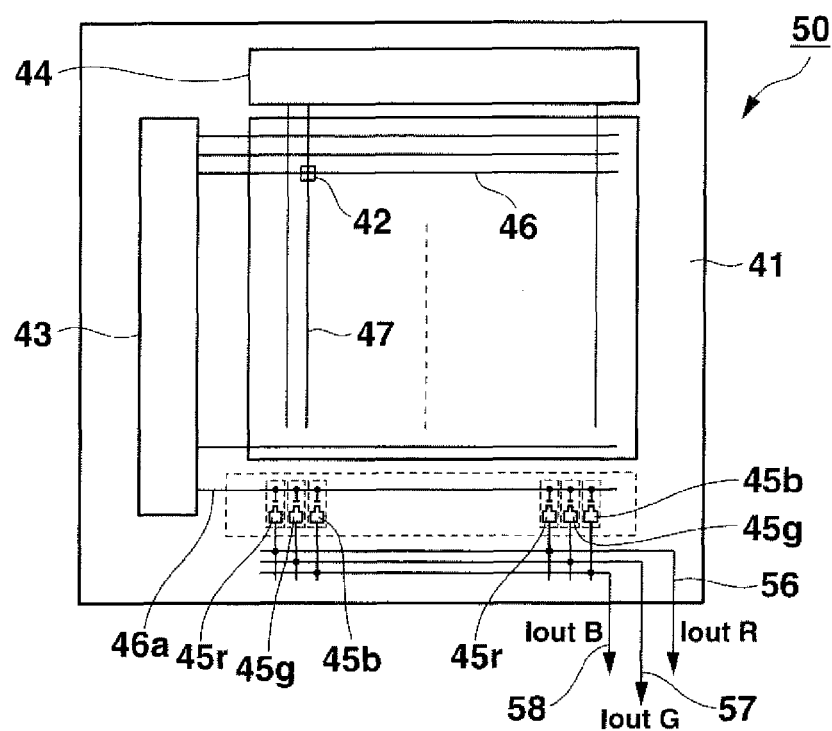
FIG. 16A is a schematic plan view illustrating another construction of a display device.
Figure 16B:
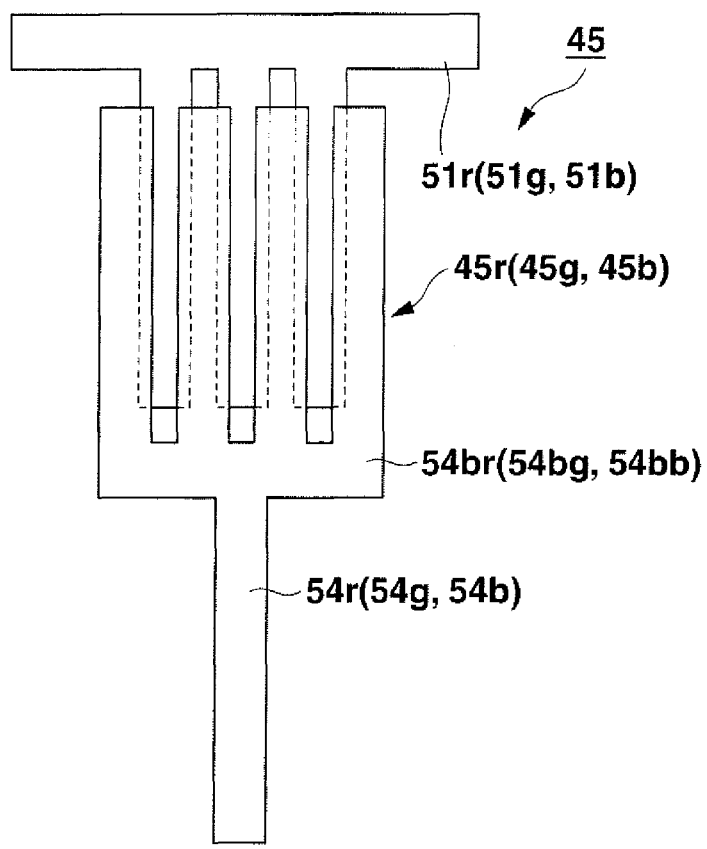
FIG. 16B is a magnified plan view of a photo-sensing device.

FIG. 16A is a schematic plan view illustrating another construction of the display device, and FIG. 16B is a magnified plan view of a photo-sensing device.

In FIG. 16A, the device 50 is a full-color display device in which three data lines, 47r, 47g, and 47b are provided for each of the three primary colors, namely, red, green, and blue. Corresponding to these data lines, photo-sensing devices, 45r, 45g, and 45b are provided for each of the colors, red, green, and blue, in response to the layout interval of each data line, 47r, 47g, and 47b along the gate line 46a.

In FIG. 16A, the structure of the photo-sensing devices, 45r, 45g, and 45b is the same as that of the photo-sensing device 45, for example. The photo-sensing device for red color 45r is provided with a connection wiring 54r including a connecting portion 54br and the first electrode 51r on its surface. The photo-sensing device for green color 45g and that for blue color 45b also have the same structures as the photo-sensing device for red color 45r. Furthermore, a color filter (not shown) provided over the pixel display part 42 for each color is also provided to cover the corresponding photo-sensing devices, 45r, 45g, and 45b.

Each of the connection wirings 54r of the multiple photo-sensing devices 45r for detecting red color provided for each of the data line 47 is connected to the red color output wiring 56, and a current is output to outside as output current, IoutR, via the red color output wiring 56. Similarly, each of the connection wiring 54g and 54b of multiple photo-sensing devices 45g and 45b for detecting green and blue colors provided for each of the data line 47 is also connected to the green and blue color output wirings 57 and 58, and output to outside as output current, IoutG and IoutB. In this case, the total number of photo-sensing devices 45r, 45g, and 45b is three times the number of the data lines.

In this case, the photo-sensing devices 45r, 45g, and 45b for each color have the same structure as the photo-sensing device 10 shown in FIG. 1A, for example. They are formed on the substrate 41 simultaneously with the TFT by following the same manufacturing process as the TFTs of the pixel display part 42. At this time, each photo-sensing device 45r, 45g, and 45b having the same structure is formed within a 2 mm square, for example. As shown in FIG. 16B, the first electrode 51 shown at the upper side of the page is connected to the gate line 46a for each of the photo-sensing devices 45r, 45g, and 45b for three colors.

According to the display device 50 in this embodiment, the gate signals and data signals are transmitted by the gate driver 43 and the data driver 44 to each of the gate lines 46 and data lines 47r, 47g, and 47b based on the image signals input from outside, and consequently the drive of the image display device 42 is controlled so as to display full-color image using three primary colors.

The gate driver 43 transmits pulse signals to the first electrode 51 of each of the photo-sensing devices 45r, 45g, and 45b via the gate line 46a, and consequently the photo-sensing devices 45r, 45g, and 45b output the output currents, Iout, corresponding to the intensity of the incident light L. Therefore, the illuminance signal having the voltage corresponding to the intensity of the incident light L by each color can be obtained by processing these output current, Iout, to current-voltage conversion with the photosensor 25 or 30 shown in FIG. 6 or FIG. 9, for example. Consequently, the display device 50 ensures accurate adjustment of illuminance with the backlight part as in the case of the display device 40 shown in FIG. 15.

Furthermore, in the display device 50, the illuminance of each color of the incident light L is detected by the photo-sensing devices 45r, 45g, and 45b, respectively. Consequently, when the surrounding area is illuminated with bluish light, the apparent screen display can be corrected by highlighting the blue display of the display device 50. In addition, the illuminance can be detected accurately irrespective of the type of the light source. The spectral response of the photo-sensing devices 45r, 45g, and 45b is not identical to the visual sensitivity of human eye. Consequently, there may be a case in which the brightness is felt the same by humans but detected illuminance varies, if a single photo-sensing device 45 is used. On the contrary, by using the photo-sensing devices 45r, 45g, and 45b for each color, accurate illuminance can be calculated based on the illuminance of each color detected, irrespective of the type of the light source.

In the display device 50, data lines 47 are provided for each of the three primary colors for color display in each pixel, and photo-sensing devices 45r, 45g, and 45b are provided in accordance with the arrangement cycle of the data lines 47 for each color. A color filter that covers the pixel display part 42 extends along the data line 47, covering the corresponding photo-sensing devices 45r, 45g, and 45b. Each connection wiring 54r, 54g, and 54b of the photo-sensing devices 45r, 45g, and 45b corresponding to the data line 47 for each color are connected to each other, and to the wiring for red color output 56, green color output 57, and blue color output 58, respectively. In this case, by providing photo-sensing devices 45r, 45g, and 45b for each of the data line 47, the output current, Iout, for each color increases as a whole, thus enhancing the sensitivity to incident light L even with a full-color display device.

The display devices 40 and 50 are configured as dot-matrix type TFT liquid crystal display device. However, the photo-sensing device 45 of the present invention can be applied not only to TFT liquid crystal display device but also to other dot-matrix type display devices equipped with a backlight part, to detect the intensity of incident light L accurately. For example, in the display devices 40 and 50 equipped with a touch panel, the photo-sensing device 45 can be provided on the pixel display part 42 or on each of the multiple pixel display part 42 to detect the change of incident light L that occurs as a result of contact by human fingers, etc.

The present invention allows various modifications beyond the above-mentioned embodiments within the scope of the invention described in the claims, and it goes without saying that they are included in the scope of the present invention.

What is claimed is:

1. A photo-sensing device comprising:
    a photoelectric conversion semiconductor thin film,
    a first conductive type semiconductor thin film provided to form an incident light window on one face of the photoelectric conversion semiconductor thin film,
    multiple electrodes provided over the first conductive semiconductor thin film, partially covering the first conductive semiconductor thin film,
    a connection wiring that short-circuits the multiple electrodes for output,
    an insulating film provided on the other face of the photoelectric conversion semiconductor thin film,
    a first electrode provided on the face of the insulating film that does not contact the photoelectric conversion semiconductor thin film, and
    a voltage source electrically connected to the connection wiring and the first electrode,
    wherein,
    the multiple electrodes and the connection wiring are integrated into one,
    the voltage source applies an AC voltage between the connection wiring and the first electrode so that a current flows between the connection wiring and the first electrode, the amount of said current generated being dependent upon the amount of an incident light received by the photoelectric conversion semiconductor thin film through the incident light window.

2. The photo-sensing device as set forth in claim 1, wherein the AC voltage causes, at least at some instant, the interface between the photoelectric conversion semiconductor thin film and the insulating film to become the second conductive type.

3. The photo-sensing device as set forth in claim 1, wherein the multiple electrodes are divided into multiple teeth on a face approximately parallel to the first electrode to form a comb shape.

4. The photo-sensing device as set forth in claim 1, wherein the edges on the side of the first electrode of the multiple electrodes are connected to each other.

5. A photosensor including:
a photo-sensing device and an output signal processing circuit,
said photo-sensing device comprising:
a photoelectric conversion semiconductor thin film,
a thin film for ohmic contact provided to form an incident light window on one face of the photoelectric conversion semiconductor thin film,
a first and a second ohmic electrodes provided on the thin film for the ohmic contacts,
a connection wiring that short-circuits the first ohmic electrode and the second ohmic electrode,
an insulating film provided on the other face of the photoelectric conversion semiconductor thin film,
a first electrode provided on the face of the insulating film that does not contact the photoelectric conversion semiconductor thin film, and
a voltage source electrically connected to the connection wiring and the first electrode,
wherein, the voltage source applies an AC signal between the connection wiring and the first electrode of the photo-sensing device so that a current flows between the connection wiring and the first electrode of the photo-sensing device, the amount of said current generated being dependent upon the amount of an incident light received by the photoelectric conversion semiconductor thin film through the incident light window,
the connection wiring or the first electrode is connected to the output signal processing circuit, and
the output signal processing circuit converts the current into an output voltage.

6. The photosensor as set forth in claim 5, wherein a pulse signal generation circuit is connected to the first electrode.

7. The photosensor as set forth in claim 5, wherein the output signal processing circuit includes a current-voltage conversion circuit comprising an operational amplifier and a resistance.

8. The photosensor as set forth in claim 5, wherein the output signal processing circuit includes a detection circuit comprising a resistor and a capacitor.

9. The photosensor as set forth in claim 5, wherein the output signal processing circuit includes an AD conversion circuit in which the output voltage converted from current is processed to AD conversion.

10. The photosensor as set forth in claim 5 or 9, wherein the pulse signal is input into the AD conversion circuit as trigger signals.

11. A photosensor including:
a photo-sensing device,
an AC voltage application means for applying AC voltage to the photo-sensing device, and
a current detection means to be connected to the photo-sensing device,
said photo-sensing device comprising:
a first electrode in specified surface structure provided via an insulating film on one side of the layer thickness direction of the semiconductor thin film, and
a second and a third electrodes electrically connected to each other and provided on the other side of the other layer thickness direction so that a part of them is overlapped with the first electrode, wherein,
the AC voltage is applied by the AC voltage application means between the second and third electrodes, and the first electrode of the photo-sensing device, and
a current that is flown between the second and third electrode, and the first electrode of the photo-sensing device is detected by the current detection means.

12. The photosensor as set forth in claim 11, wherein the semiconductor thin film consists of at least 2 layers of n-type semiconductor films having different impurity concentrations.

13. The photosensor as set forth in claim 11, wherein the semiconductor thin film has layered structure of an n-type semiconductor thin film and an intrinsic semiconductor thin film.

14. The photosensor as set forth in claim 13, wherein the intrinsic semiconductor thin film is provided on the side of the insulating film, and the n-type semiconductor film is provided on the side of the second or the third electrode.

15. The photosensor as set forth in claim 14, wherein the surface structure of the n-type semiconductor thin film at the place overlapped with the first electrode is identical with the second and the third electrodes.

16. The photosensor as set forth in anyone of claims 11 to 15, wherein the second and the third electrodes are electrically connected in a position different from the position overlapped with the first electrode.

17. The photosensor as set forth in claim 11, wherein the AC voltage has a rectangular waveform.

18. A display device comprising:
a gate driver,
a data driver,
a pixel display part formed on a substrate, and
a photo-sensing device,
said pixel display part including:
gate lines that extend in the first direction in parallel to each other on the surface of the substrate, and to which gate signals are supplied from the gate driver, and
data lines that extend in the second direction, which is different from the first direction, in parallel to each other and to which data signals are supplied from the data driver,
wherein pixels formed at the cross-sectional area of the gate lines and the data lines are provided in the pixel display part, and the pixels are driven via the gate lines and the data lines, and
said photo-sensing device comprising:
a photoelectric conversion semiconductor thin film provided on the substrate,
a thin film for ohmic contacts provided to form an incident light window on one face of the photoelectric conversion semiconductor thin film,
a first and a second ohmic electrodes provided on the thin film for ohmic contacts,
a connection wiring for short-circuiting the first ohmic electrode and the second ohmic electrode,
an insulating film provided on the other face of the photoelectric conversion semiconductor thin film, and
a first electrode provided on the face of the insulating film that does not contact the photoelectric conversion semiconductor thin film,
wherein the gate driver applies pulse signals to the gate lines of the pixel display part and the first electrode of the photo-sensing device.

19. The display unit as set forth in claim 18, wherein the photo-sensing device outputs a charge which changes according to the amount of an incident light coming into the photoelectric conversion semiconductor thin film.

20. The display unit as set forth in claim 18, wherein the first and the second ohmic electrodes are divided into multiple teeth on a face approximately parallel to the first electrode to form a comb shape.

21. The display unit as set forth in claim 20, wherein the edges of the comb-shaped electrodes of the first and the second ohmic electrodes on the side of the first electrode are connected to each other.

22. The display device as set forth in claim 18, wherein the gate driver is equipped with an exclusive gate line for the photo-sensing device, and the exclusive gate lines is connected to the first electrode.

23. The display device as set forth in claim 18, wherein the photo-sensing device is provided adjacent to the outermost side of the gate lines.

24. The display device as set forth in claim 18, wherein the photo-sensing device is provided along the gate lines, covering the entire area where data lines are provided.

25. The display device as set forth in claim 18, wherein each pixel display part is provided with data lines for three primary colors, the photo-sensing devices are provided according to the layout intervals of the data lines, a color filter that covers the pixel display part extends along the data lines, covering the corresponding photo-sensing device, and the connection wirings of the photo-sensing devices corresponding to each color of the data lines are connected to each other.

26. A display device comprising:
a pixel display part including:
gate lines from which gate signals are supplied and data lines from which data signals are supplied, and
a photosensor for operating the display status of said pixel display part, wherein,
said photosensor comprising:
a photo-sensing device including;
a first electrode in specified surface structure provided via an insulating film on one side of the layer thickness direction of the semiconductor thin film, and a second and a third electrodes electrically connected to each other and provided on the other side of the other layer thickness direction so that a part of them is overlapped with the first electrode,
an AC voltage application means for applying the AC voltage between the second and third electrode, and the first electrode of the photo-sensing device; and
a current detection means for detecting a current flown between the second and the third electrode, and the first electrode of the photo-sensing device,
wherein said AC voltage application means applies gate signals to be supplied to the gate lines between the second and the third electrodes, and the first electrode.

27. A photosensor comprising:
an electrode;
an insulating film on the electrode;
a semiconductor film formed on the insulating film so as to overlap the electrode, the semiconductor film generating carriers in accordance with the amount of light received thereby;
an ohmic contact layer on the semiconductor film on a side opposite from the insulating film, the ohmic contact layer exposing at least a part of a surface of the semiconductor film to define a light receiving window on the semiconductor film at a location that at least partially overlaps the electrode to receive light through the light receiving window;
a voltage source electrically connected to at least one of the electrode and the ohmic contact layer, the voltage source causing a time-varying voltage to be applied between the electrode and the ohmic contact layer so that a current flows between the electrode and the ohmic contact layer through the insulating film and through the semiconductor film in response to the applied time-varying voltage, the amount of said current so generated being dependent upon the amount of the light received by the semiconductor film; and
a detector that detects said current generated in response to the applied time-varying voltage so as to detect the amount of the light received by the semiconductor film.

28. The photosensor according to claim 27, wherein the ohmic contact layer is an n-type semiconductor layer and includes a first n-type semiconductor portion and a second n-type semiconductor portion,
wherein the photosensor further comprises a connection conductor electrically connecting the first n-type semiconductor portion to the second n-type semiconductor portion so that a potential applied to the connection conductor is transferred to the first and second n-type semiconductor portions,
wherein the voltage source is electrically connected to at least one of the electrode and the connection conductor, and
wherein the time-varying voltage contains a DC bias component biasing the electrode negatively relative to the ohmic contact layer so that positively charged carriers are induced in the semiconductor film adjacent to an interface between the insulating layer and the semiconductor film.

29. The photosensor according to claim 27, wherein the ohmic contact layer is an n-type semiconductor layer and includes a first n-type semiconductor portion and a second n-type semiconductor portion,
wherein the photosensor further comprises a connection conductor electrically connecting the first n-type semiconductor portion to the second n-type semiconductor portion so that a potential applied to the connection conductor is transferred to the first and second n-type semiconductor portions,
wherein the voltage source is electrically connected to at least one of the electrode and the connection conductor, and
wherein the time-varying voltage contains a DC bias component biasing the electrode positively relative to the ohmic contact layer so that negatively charged carriers are induced in the semiconductor film adjacent to an interface between the insulating layer and the semiconductor film.

30. The photosensor according to claim 27, further comprising a substrate, wherein the electrode is formed on the substrate.

* * * * *